(12) United States Patent
Hosoyamada et al.

(10) Patent No.: US 7,193,320 B2
(45) Date of Patent: Mar. 20, 2007

(54) SEMICONDUCTOR DEVICE HAVING A HEAT SPREADER EXPOSED FROM A SEAL RESIN

(75) Inventors: Sumikazu Hosoyamada, Kawasaki (JP); Yoshitsugu Kato, Kawasaki (JP); Mitsuo Abe, Kawasaki (JP); Kazuto Tsuji, Kawasaki (JP); Masaharu Minamizawa, Kawasaki (JP); Toshio Hamano, Kawasaki (JP); Toshiyuki Honda, Kawasaki (JP); Katsuro Hiraiwa, Kawasaki (JP); Masashi Takenaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,074

(22) Filed: Jan. 28, 2003

(65) Prior Publication Data
US 2003/0222344 A1   Dec. 4, 2003

(30) Foreign Application Priority Data
May 30, 2002 (JP) .............................. 2002-158277

(51) Int. Cl.
*H01L 23/06* (2006.01)
(52) U.S. Cl. ...................... 257/738; 257/684; 257/796
(58) Field of Classification Search ................ 257/738, 257/737, 684, 796, 786, 784
See application file for complete search history.

(56) References Cited

U.S. PATENT DOCUMENTS

| 5,838,072 | A | 11/1998 | Li et al. |
| 6,020,637 | A | 2/2000 | Karnezos |
| 6,046,495 | A | 4/2000 | Usushima |
| 6,175,153 | B1 | 1/2001 | Yamada |
| 6,291,884 | B1 * | 9/2001 | Glenn et al. ................ 257/747 |
| 6,300,685 | B1 * | 10/2001 | Hasegawa et al. .......... 257/780 |
| 6,445,077 | B1 * | 9/2002 | Choi et al. .................. 257/786 |
| 6,507,114 | B2 * | 1/2003 | Hui et al. .................... 257/738 |

(Continued)

FOREIGN PATENT DOCUMENTS
DE        100 23 823 A1      12/2001

(Continued)

OTHER PUBLICATIONS

Wolf et al., Silicon Processing for the VLSI Era, Lattice Press, vol. 1, pp. 857-858.*

(Continued)

*Primary Examiner*—Leonardo Andujar
(74) *Attorney, Agent, or Firm*—Westerman, Hattori, Daniels & Adrian, LLP.

(57) ABSTRACT

A semiconductor element has a circuit formation surface on which electrode terminals are arranged in a peripheral part thereof. The semiconductor element is encapsulated by a mold resin on a substrate which has openings at positions corresponding to the electrodes of the semiconductor element. The semiconductor element is mounted to the substrate in a state where the circuit formation surface faces the substrate and the electrode terminals are positioned at the openings and a back surface opposite to the circuit formation surface of the semiconductor element is exposed from the mold resin. A heat-emitting member formed of a metal plate is provided on a surface of the substrate opposite to a surface on which the semiconductor element is mounted. The surface of the heat-emitting member being exposed from the mold resin.

12 Claims, 18 Drawing Sheets

U.S. PATENT DOCUMENTS

| | | | |
|---|---|---|---|
| 6,509,642 B1 * | 1/2003 | Cohn | 257/712 |
| 6,528,408 B2 * | 3/2003 | Kinsman | 438/613 |
| 2001/0028110 A1 | 10/2001 | Andoh | |

FOREIGN PATENT DOCUMENTS

| | | |
|---|---|---|
| EP | 0 883 180 A2 | 12/1998 |
| JP | 05 243317 | 9/1993 |
| JP | 06 084993 | 3/1994 |
| JP | 09-199629 | 7/1997 |
| JP | 09 237853 | 9/1997 |
| JP | 10-74795 | 3/1998 |
| JP | 10-74861 | 3/1998 |
| JP | 10-321670 | 12/1998 |
| JP | 11 031775 | 2/1999 |
| JP | 2000-150730 | 5/2000 |

OTHER PUBLICATIONS

Shinko, JP-10074861 translation, Mar. 17, 1998.*

Japanese Office Action dated Sep. 19, 2006 (mailing date), issued in corresponding Japanese Patent Application No. 2002-158277.

* cited by examiner

SEMICONDUCTOR DEVICE HAVING A HEAT SPREADER EXPOSED FROM A SEAL RESIN

BACKGROUND OF THE INVENTION

1. Field of the Invention

The present invention generally relates to semiconductor devices and, more particularly, to a semiconductor device which is excellent in heat dissipation and is capable of effectively supply an electric power by reducing a direct-current resistance of wiring.

2. Description of the Related Art

With an increase in the number of I/O terminals formed in a semiconductor element, the power consumption of a semiconductor element tends to increase. Additionally, the package size of a semiconductor device has also been increasing due to the increase in the number of terminals. There is a fine pitch ball grid array (FBGA) type semiconductor device as a semiconductor package developed so as to solve such problems.

FIG. 1 is a cross-sectional view of a conventional fine pitch ball grid array type semiconductor device. In a conventional fine pitch ball grid array type semiconductor device, a semiconductor element 1 is mounted on a printed circuit board or a tape substrate 3 through an adhesion material 2. Electrode terminals 1a of the semiconductor element 1 are electrically connected to bonding leads 5 formed in the printed circuit board or tape substrate 3 by bonding wires 4. The semiconductor element 1 and the bonding wires 4 are encapsulated by a mold resin 6 on the printed circuit board or tape substrate 3. The bonding leads 5 and terminals formed on the printed circuit board or tape board 3 are connected to solder balls 7 serving as external connection terminals formed on the opposite side.

In the fine pitch ball grid array type semiconductor device having the above-mentioned structure, a large part of heat emitted from the semiconductor element 1 is emitted to the exterior of the semiconductor device by being transmitted through the mold resin 6, or is transmitted to the printed circuit board or tape substrate 3 through the adhesion material 2, and is emitted to the exterior of the semiconductor device from the printed circuit board or tape substrate 3. The semiconductor device using the conventional BGA (ball grid array) or PGA (pin grid array) package can be classified into tape automated bonding (TAB), wire-bonding and flip-chip bonding with respect to the connection method of a package and a semiconductor chip.

Moreover, the electrode arrangement of a semiconductor chip is roughly classified into a peripheral electrode arrangement, in which electrodes are arranged a single row or a small number of rows on the periphery of the semiconductor chip, and an area electrode arrangement, in which electrodes are arranged over the entire surface of the semiconductor chip. The combinations of the connection method and the electrode arrangement is described below.

Combination (1): Peripheral electrode arrangement+TAB connection

Combination (2): peripheral electrode arrangement+wire-bonding connection

Combination (3): area electrode arrangement+flip-chip-bonding connection

Generally (1) and (2) can make the pitch between electrodes more miniaturized as compared with (3). As of 2002, the electrode pitch to which TAB connection can respond is about 40 μm, and 40 μm (wedge wire-bonding connection) or 60 μm (ball wire-bonding connection) according to wire-bonding connection. Furthermore, in wire-bonding connection, an apparent pitch can be set to a half of the pitch at the time of a single row arrangement by locating the above-mentioned electrodes in a zigzag arrangement.

On the other hand, (3) is about 180 μm. Although the electrode pitch of a semiconductor element can be miniaturized according to 1), it needs to provide bumps (projections) such as gold on the electrodes, which may be a cause of cost increase for a large semiconductor element or a low-yield semiconductor element. Moreover, the combination of a semiconductor element and a substrate becomes one kind, thereby lacking versatility. However, when a flexible board is used as a substrate of a package, there is an advantage that bonding terminals can be formed on the substrate itself.

If it is applied to a small, high-yield semiconductor element in which wiring can be achieved with a substrate having one or two conductive layers, the semiconductor device can be at a low cost.

Since (2) has flexibility in an angle of development, (2) has advantages that an internal electrode pitch of a package substrate side can be enlarged and the selection range of substrate materials becomes wider and a plurality of semiconductor elements having different electrode arrangements can be mounted to a package substrate.

With respect to the expansion of the selection range of the substrate materials, (2) may have large advantage when a larger number of conductive layers are required than (1). Currently, (2) is a combination having positions which sandwiches (1) at a cost/performance ratio and oriented to a semiconductor element which becomes expensive when bump formation is performed by (1) as a low-cost semiconductor device having wire-bonding connections with an inexpensive substrate or a semiconductor device in which a power supply plane and ground plane are formed using a multi-layer substrate that requires a higher electric performance than (1).

In either case of (1) or (2), since a stress is applied to the electrodes of a semiconductor element when bonding connection is carried out, the above-mentioned bonding electrodes cannot be provided on an active element of the semiconductor element.

(3) has a smaller stress to electrodes than the connection according to (1) and (2) when bonding since bumps made of solder or the like are formed on the electrodes of the semiconductor element and the electrodes are connected to the package substrate by melting the bumps by heat. For this reason, an electrode for bonding can be located even on an active element of the semiconductor element. However, (3) requires time for a bonding process and an adhesion material to be filled between the semiconductor element and the package substrate so as to maintain reliability of the connection part, thereby increasing a cost as compared to (1) and (2).

As mentioned above, the combination of (3) facilitates a multi-electrode structure as compared to the peripheral electrode, and is positioned as a high-class semiconductor device which can permit the above-mentioned cost problems.

Moreover, in the conventional semiconductor device, groups of connection electrodes of the semiconductor element are connected to groups of internal electrodes of an interposer such a lead frame or a package substrate for each electrode function. In a semiconductor device, especially oriented to a commodity market, a semiconductor element is mounted in a semiconductor package such as QFP or BGA, and is connected electrically by a wire connection, a TAB connection, a bump connection, etc. From a viewpoint of production quantity, except for a part of the bump connection, an electrode arrangement of the semiconductor element mounted in a large part of semiconductor packages is a peripheral arrangement in which the electrodes for signals, the electrodes for grounding, the electrodes for internal power supply and the electrodes for external power supply are mixed.

In the above-mentioned structure, the mold resin 4 through which a heat from the semiconductor element 1 passes, the adhesion material 2 and the printed circuit board or tape substrate 3 are components formed of resin. The thermal conductivity of resin material is very low as compared with metal or the like. In view of the viewpoint of emitting the heat from the semiconductor element 1 outside efficiently, the above-mentioned structure where heat is transmitted only through resin parts have a problem that the efficiency is low.

Moreover, the bonding leads 5 formed on the printed circuit board or tape substrate 3 can be arranged only in the peripheral part of the semiconductor element 1. That is, the area where the bonding leads 5 can be arranged is restricted to the peripheral part of the semiconductor element 1, which becomes a problem when attaining high-integration by an increase in the number of terminals and miniaturization of the semiconductor device itself.

Moreover, a new problem due to miniaturization of the semiconductor element has become remarkable with respect to the lineup from a viewpoint of the above-mentioned cost/performance ratio. With evolution of the semiconductor manufacturing technology, design rules such as ASIC have miniaturized from 0.25 μm to 0.13 μm according to a reduction rule of about 70%. Moreover, a speed of device operation is increasing.

With such a miniaturization of the semiconductor manufacturing process and an increase in the speed of the semiconductor device, the timing design in consideration of the delay time of the device has become complicated. Especially the increase in a resistance R with miniaturization of wirings with respect to the semiconductor element of the peripheral electrode arrangement has caused problems such as an RC delay of a wiring portion or a logic gate delay due to an IR drop of a power supply. If the area electrode arrangement and the flip-chip bonding connection are used like the above-mentioned combination (3), it will become a large cost increase.

Furthermore, a problem of erroneous operation due to a voltage drop of an internal power supply in the center portion of the element has become notably in the semiconductor device mounting the element on which electrodes are peripherally arranged while an attempt of low-voltage operation has been progressed due to a request from market such as an elongation of a battery life of a portable equipment. In order to solve these problems, measures such as an increase in the number of internal power supply electrodes and the number of grounding terminals or an increase in the power supply/grounding layer are taken so as to specify by a simulation of a voltage drop part within the semiconductor element at the design stage of the semiconductor element and strengthening the power supply. However, such measures become cost rising factors, such as an increase in element size, a reduction in the number of the effective elements in a wafer or an increase in the number of wiring layers in the element. Moreover, even if such measures are taken, a conductive layer of a thickness of 1–2 μm can only be formed with a usual semiconductor element manufacturing process, and, thus, a direct-current resistance cannot be reduced sharply.

SUMMARY OF THE INVENTION

It is a general object of the present invention to provide a semiconductor device which can efficiently emit heat from a semiconductor element to an exterior of a package and attain high integration of terminals without increasing package size.

Another object of the preset invention is to provide a semiconductor device which is excellent in a cost/performance ratio while solving a problem regarding an IR drop of a power supply.

A further object of the present invention is to provide a semiconductor device which can reduce a voltage drop by greatly reducing a direct-current resistance value of wirings.

In order to achieve the above-mentioned objects, there is provided according to one aspect of the present invention a semiconductor device comprising: a semiconductor element which has a circuit formation surface on which electrode terminals are arranged in a peripheral part thereof, the semiconductor element encapsulated by a mold resin on a substrate which has openings at positions corresponding to the electrodes of the semiconductor element; the semiconductor element being mounted to the substrate in a state where the circuit formation surface faces the substrate and the electrode terminals are positioned at the openings and a back surface opposite to the circuit formation surface of the semiconductor element is exposed from the mold resin; and a heat-emitting member formed of a metal plate provided on a surface of the substrate opposite to a surface on which the semiconductor element is mounted, the surface of the heat-emitting member being exposed from the mold resin.

According to the present invention, heat is directly radiated to an atmosphere from the back surface of the semiconductor element. Moreover, the metal made heat-emitting member is provided via the substrate having a relatively small thickness and the adhesion material, and heat is radiated from the heat-emitting member to the atmosphere. Therefore, since the heat releasing path having no resin material such as the mold resin which has a large heat resistance is formed on the side of the circuit formation surface and the side of the back surface, an efficient heat release can be achieved.

In the present invention, metal made projections may be provided on the exposed surface of the heat-emitting member. Accordingly, in a case where the semiconductor device is mounted on a mounting board such as a mother board, heat transmission according to metal-to-metal contact can be achieved by contacting the metal projections provided on the heat-emitting member to the circuit pattern of the mounting board, and, thus, heat release to the exterior (mounting board) from the semiconductor device can be performed efficiently.

In the semiconductor device according to the present invention, a heat-emitting plate formed of a metal plate may be attached to the back surface of the semiconductor element, and a surface of the heat-emitting plate may be exposed from the mold resin. Accordingly, since the metal plate is provided on the back surface of the semiconductor element, the heat of the semiconductor element can be efficiently emitted to the circumference atmosphere through the metal plate.

Additionally, the electrode terminals of the semiconductor element may be formed in two rows along circumference sides of the circuit formation surface of the semiconductor element; the electrode terminals of an outer row may be connected to the terminals of the substrate formed at positions on an outer side of the openings; and the electrode terminals of an inner row may be connected to the terminals of the substrate formed at positions located on an inner side of the openings. Since the terminals such as bonding leads are formed on the opposite side of the substrate on which the semiconductor element is mounted, the number of electrode terminals provided on the semiconductor element can be increased.

In one embodiment of the present invention, the substrate may be a tape substrate. By using the tape substrate as the substrate on which the semiconductor element is mounted, the thickness of the entire semiconductor device can be reduced.

Additionally, there is provided according to the present invention a semiconductor device comprising: a first wiring board formed on a substrate and having an opening through which a surface of the substrate is exposed; a semiconductor element located in the opening and having a back surface opposite to a circuit formation surface, the back surface being bonded to the substrate; bonding wires which connects electrodes formed on the first wiring board to first electrodes arranged in a peripheral part of the circuit formation surface of the semiconductor element; a second wiring board facing the circuit formation surface of the semiconductor element and having connection members which are connected to second electrodes arranged in a center part of the circuit formation surface; first external connection terminals formed on the second wiring board and electrically connected to the connection members; and second external connection terminals formed on the first wiring board and having second external connection electrodes electrically connected to the first electrodes of the semiconductor element through wirings of the first wiring board and the bonding wires.

According to the above-mentioned invention, the external connection terminals can be electrically connected to the second electrodes of the semiconductor element through the second wiring board. Since the wiring path to the second electrodes is formed separately from the wiring path to the first electrodes, the wiring path to the second electrodes can be different construction from the wiring path to the first electrodes.

In the semiconductor device according to the above-mentioned invention, the first electrodes of the semiconductor element may be electrodes for signals and power supply or grounding; the second electrodes may be electrodes for power supply and grounding; and an arrangement pitch and an electrode size of the second electrodes may be different from an arrangement pitch and an electrode size of the first electrodes.

Accordingly, the direct-current current resistance value of the wiring path of the electrode for power supply and grounding can be made much smaller than the electrodes for signals, and a voltage drop due to the direct-current current resistance can be reduced with respect to especially the electrodes for power supply located in the center part of the semiconductor element.

In the semiconductor device according to the present invention, the second electrodes may be formed along circuit wirings for power supply or grounding formed on the circuit formation surface of the semiconductor element. Accordingly, the noise to the power supply wiring or the grounding wiring can be efficiently reduced by using as a bypass capacitor the passive element formed in the first or second wiring board.

Additionally, the connection members of the second wiring board may be made of a thermally meltable conductive material. The connection members of the second wiring board may be made of a metal wire formed in the shape of a loop.

Further, the second electrodes of the semiconductor element may have an elongated shape, and the connection members of the second wiring board may be made of a metal wire or a metal foil formed by stitch-bonding provided along the second electrodes. The substrate may be made of an electrically conductive material and the back surface of the semiconductor element is joined to the substrate by an electrically conductive bonding material. The first wiring board may be a multi-layer wiring board, and the first electrodes of the semiconductor element may be connected to electrodes formed in a different layer of the first wiring board through bonding wires. The second wiring board may be a multi-layer wiring board, and a passive element may be formed on at least one of the first and second wiring boards. The passive element may be a bypass capacitor. The semiconductor element may be located in a recess formed in the substrate; the first wiring board may be a flexible board; and electrodes of the flexible board may be connected to the first electrodes of the semiconductor element by TAB connection.

Additionally, there is provided according to the present invention a semiconductor device comprising: a semiconductor element which has a first electrodes arranged on a peripheral part of a circuit formation surface, a second electrodes arranged in an area inside an area where the first electrodes are formed on the circuit formation surface, and metal wires connecting between the first electrodes and the second electrodes; and external connection terminals electrically connected to the first electrodes.

According to above-mentioned invention, the first and second electrodes can be electrically connected by the metal wires in parallel to the circuit wiring formed on the semiconductor element. Therefore, a direct-current resistance component can be reduced by connecting the second electrodes located near the center of the semiconductor device to the external connection terminals in parallel to the circuit wiring formed on the semiconductor element.

In the above-mentioned invention, the metal wires may be joined by stitch-bonding to the first and second electrodes. Alternatively, the metal wires may be joined by ball-bonding to the first and second electrodes.

Additionally, the first electrodes may be electrodes for signals and electrodes for power supply or grounding, and the second electrodes may be electrodes for power supply or grounding. Accordingly, the electrodes for power supply and grounding which are arranged near the center part of the semiconductor device can be connected to the external connection terminals in parallel to the circuit wiring formed on the semiconductor element, and, thereby, a direct-current current resistance value of the wiring path of the electrodes for power supply and grounding to the external connection terminals can be greatly reduced.

The second electrodes may have an area larger than the first electrodes. The semiconductor element may be mounted on a wiring board in a face-up state; the first electrodes may be connected to the wiring board by metal wires; and the external connection terminals may be formed on a surface of the substrate opposite to a surface on which the semiconductor element is mounted.

Additionally, a conductive member may be provided at a position facing the circuit formation surface of the semiconductor element, and the metal wires may be electrically connected to the conductive member in a part between the first electrodes and the second electrodes. Alternatively, the semiconductor element may be mounted on a wiring board in a face-down state; the first electrodes are connected to the wiring board by flip-chip bonding; and the external connection terminals may be formed on a surface of the substrate opposite to a surface on which the semiconductor element is mounted.

Additionally, the metal wires may be electrically connected to the conductive member in a part between the first electrodes and the second electrodes. The semiconductor element may be mounted on a stage of a lead frame in a face-up state; lead terminals of the lead frame may serve as the external connection terminals; and the first electrodes may be electrically connected to the lead terminals by metal wires.

Other objects, features and advantages of the present invention will become more apparent from the detailed description when read in conjunction with the accompanying drawings.

DETAILED DESCRIPTION OF THE PREFERRED EMBODIMENTS

Figure 1:
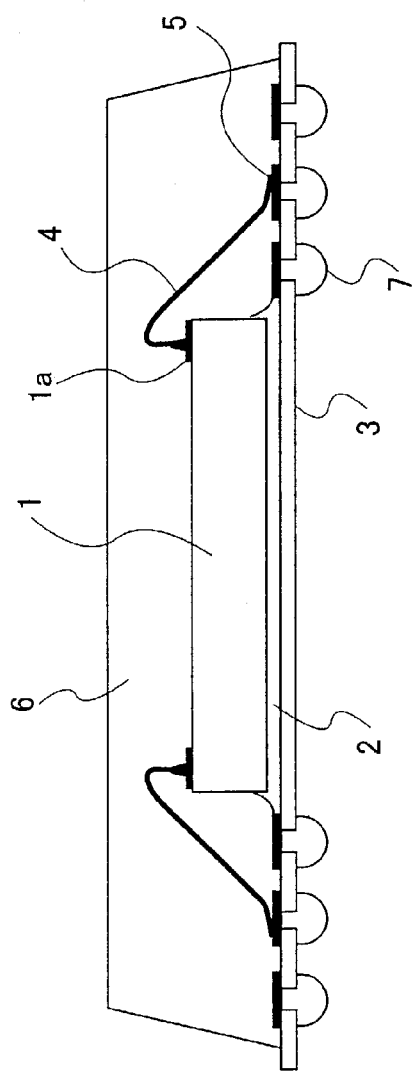
FIG. 1 is a cross-sectional view of a conventional semiconductor device of a fine pitch ball grid array type.
Figure 2:
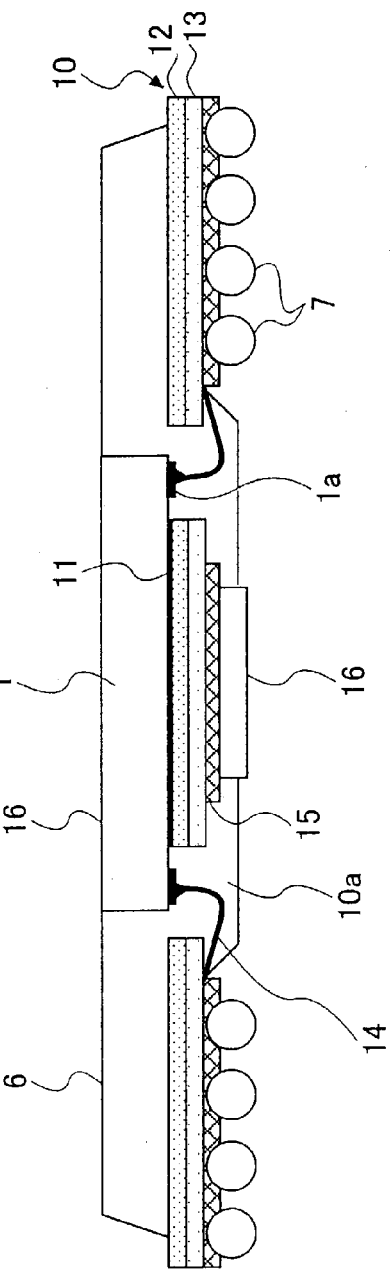
FIG. 2 is a cross-sectional view of a semiconductor device according to a first embodiment of the present invention.

A description will now be given, with reference to the drawings, of a first embodiment of the present invention. FIG. 2 is a cross-sectional view of a semiconductor device according to the first embodiment of the present invention. In FIG. 2, parts that are the same as the parts shown in FIG. 1 are given the same reference numerals, and descriptions thereof will be omitted.

In the semiconductor device shown in FIG. 2, a semiconductor element 1 is mounted to a printed circuit board 10 in a face-down state. That is, electrode terminals 1a of the semiconductor element 1 are located at an opening 10a formed in the printed circuit board 10, and the semiconductor element 1 is mounted in an area inside the opening 10a of the printed circuit board 10 by an elastomer 11 provided between an area inside the electrode terminals 1a and the printed circuit board 10. The elastomer 11 is an adhesive resin having elasticity like silicone or epoxy.

The printed circuit board 10 comprises a substrate 12 and a wiring layer 13 arranged on the substrate 12, and the semiconductor element 1 is mounted on a surface opposite to a surface on which the wiring layer 13 is formed. Circuit patterns which connect bonding leads and terminals are formed in the wiring layer 13.

The semiconductor element 1 mounted on the printed circuit board 10 is positioned so that the electrode terminals 1a are arranged within the opening 10a. Therefore, electrode terminals 1a can be connected to bonding leads formed in the wiring layer 13 by bonding wires 14 through the opening 10a. A metal heat spreader (heat dissipation member) 16 is attached via an adhesive material 15 in an area inside the opening 10a of the printed circuit board 10.

The semiconductor element 1 mounted on the printed circuit board 10 as mentioned above is encapsulated by a mold resin 6 in a state where a back surface 1b thereof is exposed to outside. Here, the opening 10a of the printed circuit board 10 is also filled up with the mold resin 6. Furthermore, the mold resin 6 is also supplied to the opposite side of the printed circuit board 10 through the opening 10a so as to encapsulate bonding wires 14, and the heat spreader 16 is also encapsulated in a state where the surface of the heat spreader 16 is exposed to outside.

The semiconductor device according to the first embodiment of the present invention is capable of transmitting and emitting efficiently a heat emitted from the semiconductor element 1 to the exterior of the semiconductor device. That is, since the back surface 1b of the semiconductor element 1 is exposed outside, a structure in which a heat is radiated through a material having a low thermal conductivity such as a resin material can be achieved and the back surface 1b of the semiconductor element 1 can emit heat outside directly. Additionally, the heat spreader 16 is provided in the area of the printed circuit board 10 having the semiconductor element 1 mounted thereon. Since the heat spreader 16 is made of metal, which has an excellent thermal conductivity, the heat spreader can radiate heat outside efficiently.

Therefore, in the semiconductor device according to the first embodiment of the present invention, a heat emitted from the semiconductor element 1 can be radiated outside efficiently, which prevents a temperature rise. That is, the semiconductor device according to the first embodiment of the present invention is excellent in a heat radiation characteristic.

It should be noted that although the semiconductor element 1 is mounted on the printed circuit board 10 in which the wiring layer 13 is formed on the substrates 12 such as BT resin or glass epoxy in the above-mentioned structure, fine patterning of the printed circuit board 10 can be achieved by using a tape substrate made of polyimide, polyester, etc. for the substrate 12, and the thickness of the semiconductor device can be reduced.

Figure 3:
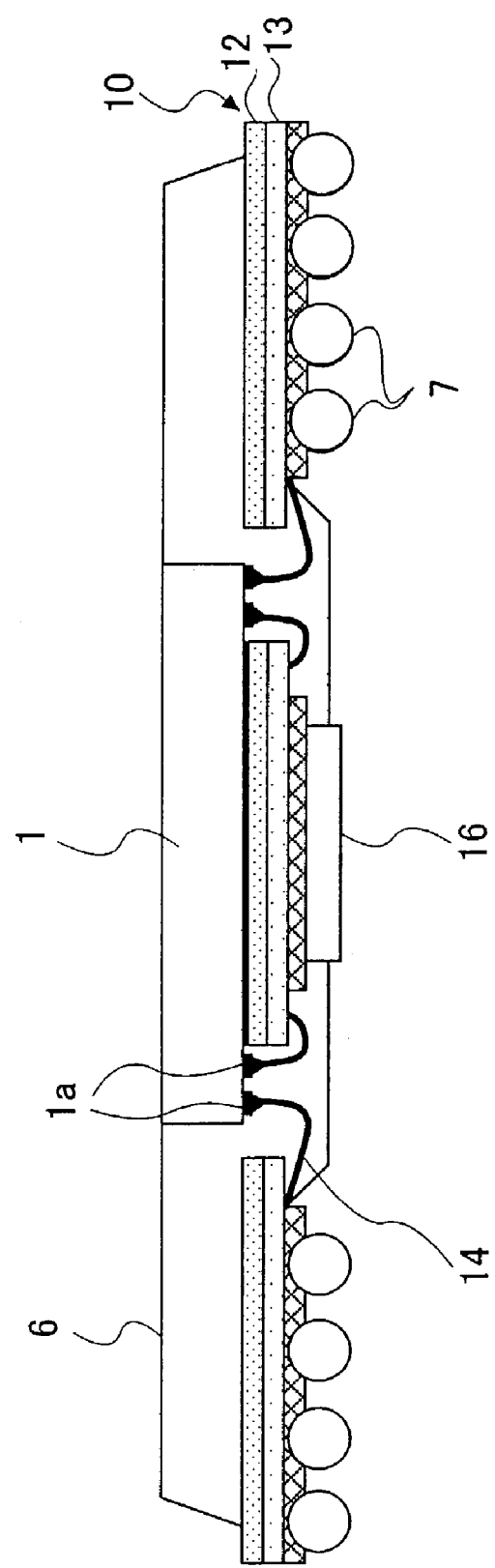
FIG. 3 is a cross-sectional view of a semiconductor device according to a second embodiment of the present invention.

A description will now be given, with reference to FIG. 3, of a second embodiment of the present invention. FIG. 3 is a cross-sectional view of a semiconductor device according to the second embodiment of the present invention. In FIG. 3, parts that are the same as the parts shown in FIG. 2 are given the same reference numerals and descriptions thereof will be omitted.

Although the semiconductor device according to the second embodiment of the present invention has the same heat-radiation structure as the above-mentioned semiconductor device according to the first embodiment, there is a difference in a structure which can cope with a case in which the number of terminals of the semiconductor element is increased.

Figure 4:
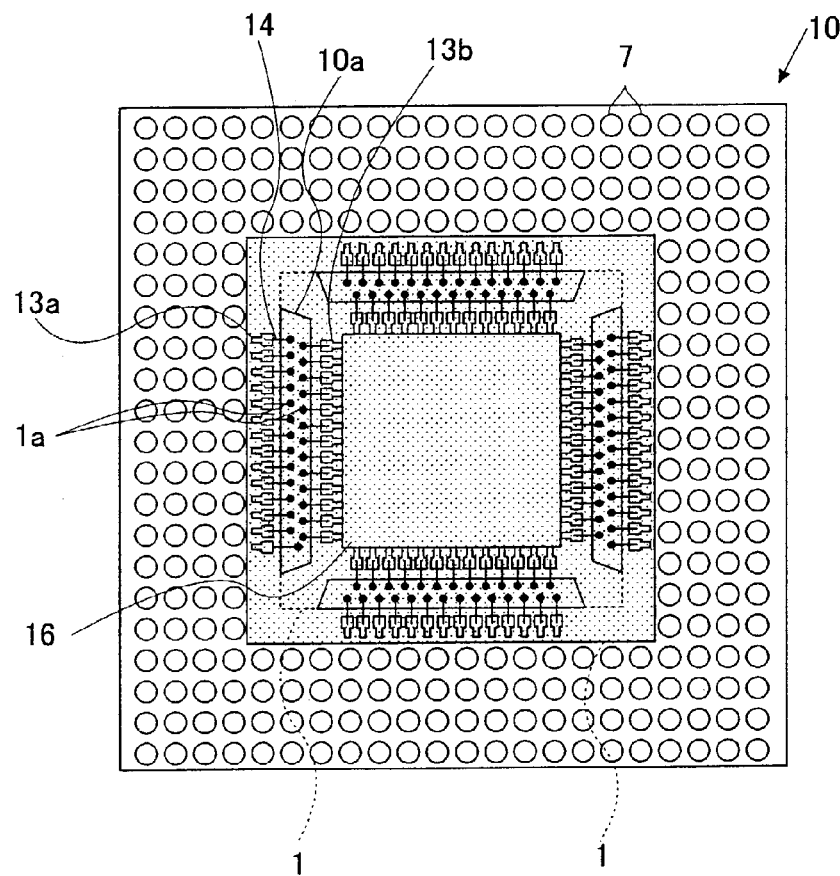
FIG. 4 is a partially perspective plan view of the semiconductor device shown in FIG. 3 viewed from a side of a heat spreader.
Figure 5:
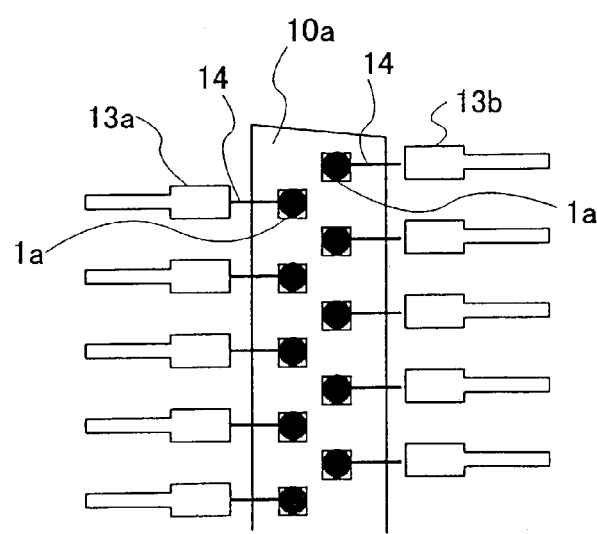
FIG. 5 is an enlarged view of a part A of FIG. 4.

That is, in the semiconductor device according to the second embodiment of the present invention, the electrode terminals 1a of the semiconductor element 1 are arranged in two rows as shown in FIG. 3. The outer electrode terminals 1a are connected to the bonding leads 13a formed in the wiring layer 13 by the bonding wires 14 similar to the example shown in FIG. 2 (refer to FIG. 4 and FIG. 5), and the inner electrode terminals 1a are connected to the bonding leads 13b formed in the wiring layer 13 in the area inside the opening 10a of the substrate 10 (refer to FIG. 4 and FIG. 5). Here, FIG. 4 shows a surface of the semiconductor device shown in FIG. 3 viewed from the side of the heat spreader. In FIG. 4, connection parts between the electrode terminals 1a of the semiconductor element 1 and the bonding leads 13a and 13b of the printed circuit board 10 are shown in a see-through manner. Additionally, FIG. 5 is an enlarged view of a part A of FIG. 4.

As mentioned above, in the semiconductor device according to the second embodiment of the present invention, since the bonding leads 13b are provided in the area inside the opening 10a of the printed circuit board 10, the number of bonding leads as the whole semiconductor device increases, and it can be coped with if the number of electrode terminals 1a of the semiconductor element 1 to be mounted is increased. Therefore, even if the number of electrode terminals of the semiconductor element increases, it is not necessary to expand the area in which the bonding leads are arranged, which results in achievement of miniaturization of the semiconductor device.

Figure 6:
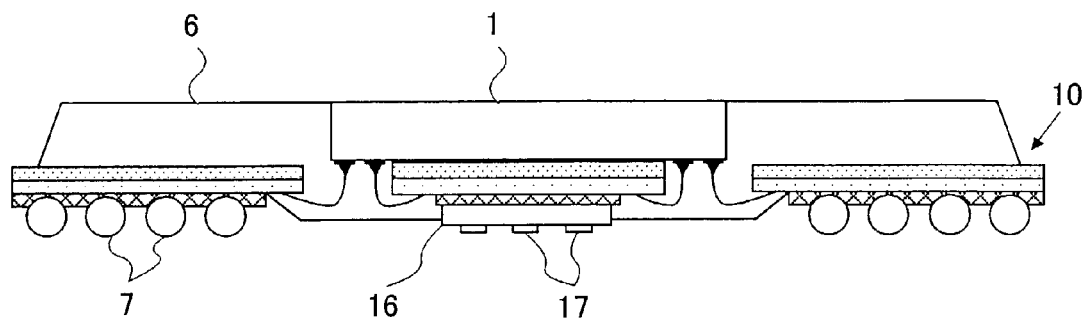
FIG. 6 is a cross-sectional view of a semiconductor device according to a third embodiment of the present invention.
Figure 7:
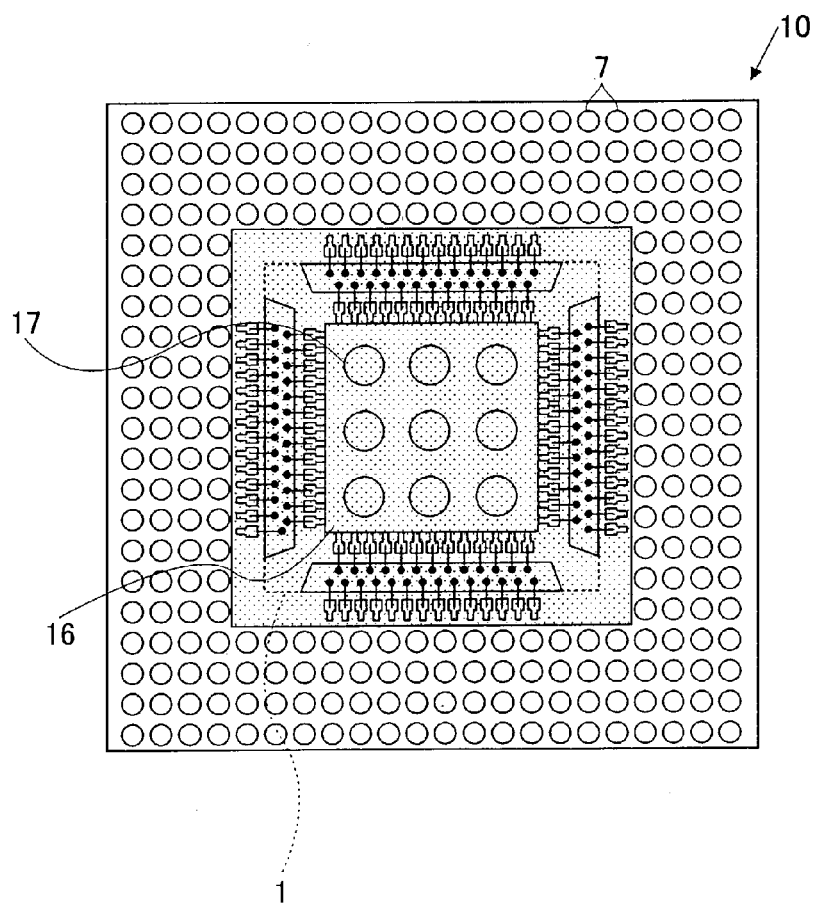
FIG. 7 is a partially perspective plan view of the semiconductor device shown in FIG. 6 viewed from a side of a heat spreader.

A description will now be given, with reference to FIG. 6 and FIG. 7, of a third embodiment of the present invention. FIG. 6 is a cross-sectional view of a semiconductor device according to the third embodiment of the present invention. FIG. 7 is a partially perspective view of the semiconductor device shown in FIG. 6 viewed from the side of the heat spreader. In FIGS. 6 and 7, parts that are the same as the parts shown in FIGS. 3 and 4 are given the same reference numerals, and descriptions thereof will be omitted.

The semiconductor device according to the third embodiment of the present invention has the same structure as the semiconductor device according to the second embodiment shown in FIG. 3 except for bumps being provided to the heat spreader 16. The bumps 17 are made of metal and have excellent thermal conductivity, and are formed on the exposed surface of the heat spreader 16. When the semiconductor element is mounted on a mounting substrate such as a motherboard, the bumps 17 are formed so as to contact a part of the mounting substrate. Therefore, in a state in which the semiconductor device according to the third embodiment of the present invention is connected to the mounting substrate, a heat generated in the semiconductor device and transmitted to the heat spreader 16 is efficiently radiated to the mounting substrate through the bumps 17 formed on the heat spreader 16.

It should be noted that heat can be more efficiently radiated by contacting the bumps 17 into the part formed with the same material as the circuit pattern formed on a motherboard.

Figure 8:
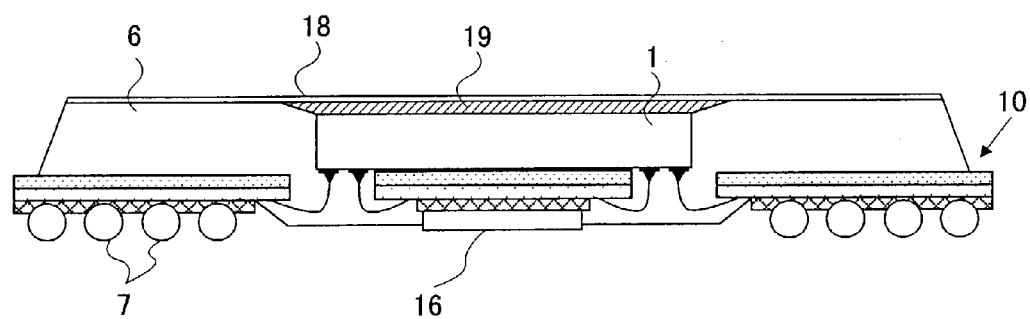
FIG. 8 is a cross-sectional view of a semiconductor device according to a fourth embodiment of the present invention.

A description will now be given, with reference to FIG. 8, of a fourth embodiment of the present invention. FIG. 8 is a cross-sectional view of a semiconductor device according to the fourth embodiment of the present invention. In FIG. 8, parts that are the same as the part shown in FIG. 3 are given the same reference numerals, and descriptions thereof will be omitted. The semiconductor device according to the fourth embodiment of the present invention has the same structure as the semiconductor device according to the second embodiment shown in FIG. 3 except for a heat radiation plate 18 being formed on the back surface 1a of the semiconductor element 1.

The heat radiation plate 18 is formed of a thermally conductive material like a copper plate or an aluminum plate, and is bonded to the back surface 1a of the semiconductor element 1 by an adhesive material 19 having an excellent heat-transmission characteristic. The heat radiation plate 18 can be formed to have as area almost equivalent to a horizontal cross section of the semiconductor device. Therefore, a heat from the semiconductor element 1 is efficiently radiated to the exterior of the semiconductor device through the heat radiation plate 18.

In the present embodiment, heat can be efficiently radiated from both sides of the semiconductor element by the heat spreader 16 and the heat radiation plate 18, and a temperature rise of the semiconductor device can be suppressed efficiently. Additionally, similar to the above-mentioned second embodiment, since the bonding leads are formed also in the area inside the opening 10a of the printed circuit board 10, the number of bonding leads as the whole semiconductor device increases, and it can be coped with even if the number of the electrode terminals of the semiconductor element to be mounted is increased. Therefore, even if the number of electrode terminals of the semiconductor element increases, it is not necessary to increase the area in which the bonding leads are arranged, which results in miniaturization of the semiconductor device.

A description will now be given of a fifth embodiment of the present invention. In a semiconductor device according to the fifth embodiment of the present invention, wiring is provided to electrodes for power supply or grounding on the semiconductor element through paths different from paths to electrodes for signals.

Figure 9:
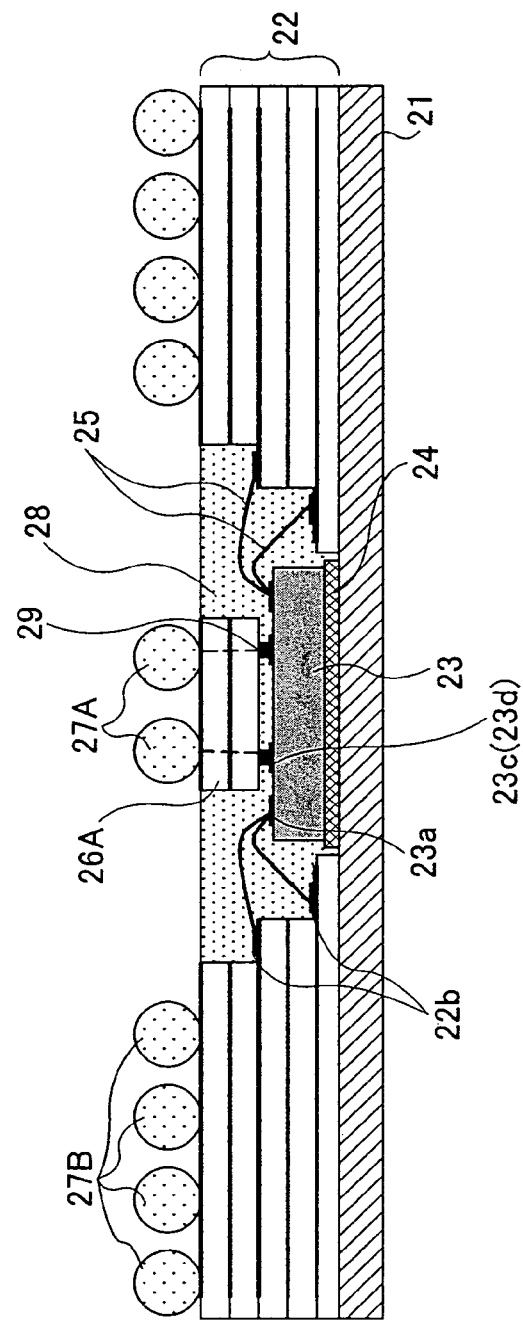
FIG. 9 is a cross-sectional view of a semiconductor device according to a fifth embodiment of the present invention.

FIG. 9 is a cross-sectional view of the semiconductor device according to the fifth embodiment of the present invention. The semiconductor device 20 shown in FIG. 9 is a so-called enhanced ball grid array (EBGA) type semiconductor device, in which a multilayer substrate 22 (first wiring substrate) and a semiconductor element 23 are mounted on conductive part 21 (substrate) serving as a grounding part. The multilayer substrate 22 has an opening 22a in the central portion thereof, and the semiconductor element 23 is accommodated in the opening 22a in a state where the semiconductor element 23 is bonded to the conductive part by an adhesive 24.

The opening 22a of the multilayer substrate 22 is formed in the form of a stairway so that electrodes 22b (electrodes for signals) formed in each layer of the multilayer substrate 22 are exposed. The electrodes 22b formed in each layer are connected to corresponding electrodes 23a (electrodes for signals) arranged around the semiconductor element 23 by bonding wires 25. Here, the electrodes 23a of the semiconductor element 23 connected to the electrodes 22b of the multilayer substrate 22 by the bonding wires 25 are electrodes for signals, and electrodes for power supply and grounding are constructed to be connectable to external parts without using the multilayer substrate 22 as mentioned later.

Figure 10A:
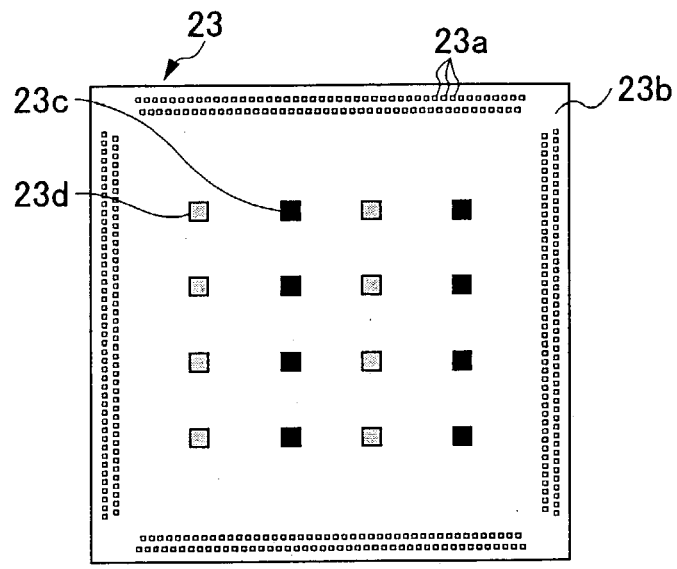
FIGS. 10A through 10D are plan views showing an arrangement of electrodes formed on a circuit formation surface of a semiconductor element.
Figure 10B:
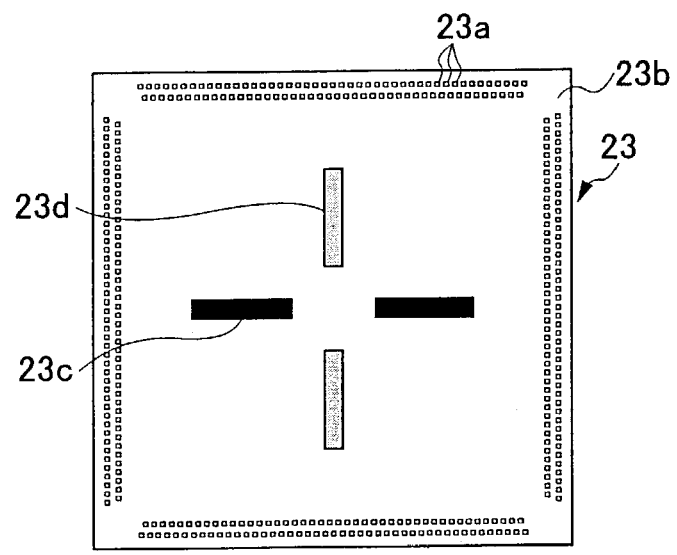
Figure 10C:
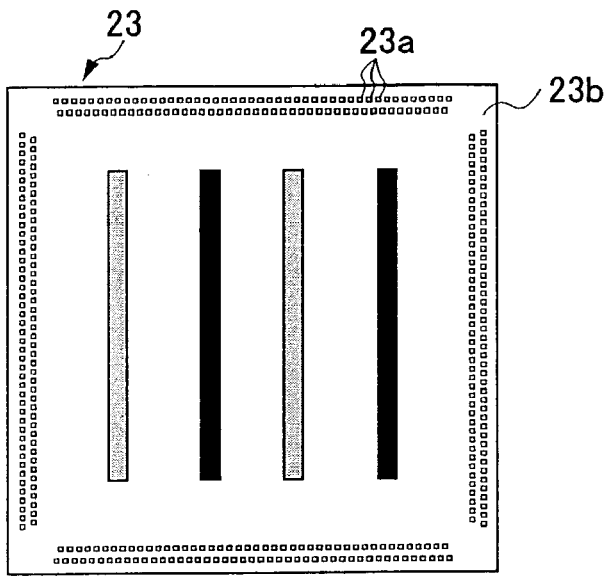
Figure 10D:
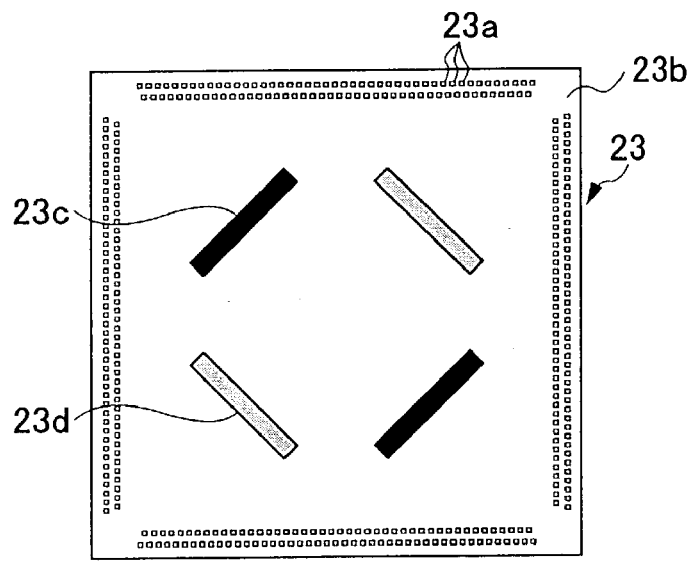

The electrodes 23a of the semiconductor element 23 are arranged in the surrounding part of the circuit formation surface 23b of the semiconductor element, and power supply electrodes 23c and grounding electrodes 24d are arranged in the central portion of the circuit formation surface 23b. FIGS. 10A through 10D are plan views showing the arrangement of the electrodes formed on the circuit formation surface 23b of the semiconductor element 23. It should be noted that the elongated power supply electrodes 23c and grounding electrodes 23d shown in FIG. 10B are formed along wires for power supply or grounding formed on the semiconductor element 23.

The comparatively small electrodes arranged in the periphery of the circuit formation surface 23b are signal electrodes 23a, and are connected to the electrodes 22b of the multilayer substrate 22 as shown in FIG. 9. On the other hand, the comparatively large electrodes arranged in the central portion of the circuit formation surface 23b are power supply electrodes 23c and the grounding electrodes 23d, and are connected to a multilayer substrate 26 (second wiring substrate) for power supply through a connecting member 29 such as a solder paste or a conductive paste and consecutively connected to solder balls 27A as external connection terminals through wiring in the multilayer substrate 26.

The semiconductor element 23, the bonding wires 25 and the multilayer substrate 26 are encapsulated by a seal resin 28 in the opening 22a. It should be noted that the signal electrodes 22b of the multilayer substrate 22 are connected to solder balls 27B as external connection terminals formed in the front surface through wiring in the multilayer substrate 22.

Therefore, as for the solder balls as the external connection terminals, the solder balls 27A for power supply connection or grounding connection are arranged in the central portion and the solder balls 27B for signal connection are arranged in the peripheral portion.

Additionally, in order to connect the electrodes of the multilayer substrate 26 to the power supply electrodes 23c and the grounding electrodes 23d of the semiconductor element 23, the above-mentioned connection member 29 may be formed as protruding electrodes by forming loops of bonding wires. The location of the multilayer substrate 26 can be adjusted by using elasticity of the loop of the bonding wires, and the surface in which the solder balls 27A and 27B as external connection terminals are formed can be made flat by aligning the top surface of the multilayer substrate 26 and the top surface of the multilayer substrate 22 with each other.

Furthermore, in the case of the connection members 29 which are connected to the elongated power supply electrodes 23c and grounding electrodes 23d, a metal wire or meal foil belt may be provided over the substrate 26 and is connected to the electrodes of the substrate 26 by stitch bonding. According to such connection member 29, the lifted parts between stitch-bonded points serve as the above-mentioned loops, which provides elasticity to the connection members. It should be noted that the stitch bonding will be described in detail in an embodiment mentioned later.

As shown in FIGS. 10A through 10D, in the semiconductor device 20 having the above-mentioned structure, the electrode pitch and the size of the power supply electrodes 23c and the grounding electrodes 23d can be larger than that of the signal electrodes 23a by collectively forming the power supply electrodes 23c and the grounding electrodes 23d through which a larger current flows as compared to the signal electrodes 23a in the central portion of the semiconductor element, and a low-cost mounter bonding may be used which reduces a voltage drop (IR drop) due to a resistance loss in the power supply electrodes 23c and the grounding electrodes 23d.

Moreover, a part of the power supply electrodes or grounding electrodes may be included in the arrangement of the signal electrodes 23a of the semiconductor element 23. That is, power supply in the circuit formed near the peripheral part of the semiconductor element 23 is performed through the electrodes arranged around the semiconductor element 23 (in this case, a power is also supplied through the bonding wires 25 from the multilayer substrate 22), and power supply in the circuit formed near the central portion of the semiconductor element 23 is performed through the electrode arranged in the central portion of the semiconductor element. Therefore, power supply can be performed from the location near the circuit which needs power supply in the semiconductor element 23, and the length of power supply wiring on the semiconductor element can be reduced, thereby reducing the IR drop.

Moreover, the power supply electrodes 23c and the grounding electrodes 23d are connected to the solder balls 27 serving as external connection terminals through separate and exclusive wiring paths (wiring formed in the multilayer substrate 26) without passing through the multilayer substrate 22 for signal wiring. For this reason, the wiring paths for power supply to the semiconductor element 23 can be designed separately from the wiring paths for signals, and, thus, there is no restriction caused by the wiring paths for signals and the wiring paths for power supply can be designed independently. Also in this respect, the IR drops can be reduced.

Furthermore, the power supply electrodes and grounding electrodes conventionally arranged around the semiconductor element can be moved to the central portion of the semiconductor element which is not used conventionally, and the number of the electrodes provided in the peripheral portion can be increased correspondingly. Thus, a semiconductor device having larger number of electrodes can be achieved in the same size. Or by reducing the number of the electrodes which are provided in the peripheral portion, the outer configuration of a semiconductor element can be made smaller, thereby achieving miniaturization of the semiconductor device. Moreover, the power supply layer of the multilayer substrate 22 can be omitted, and the manufacturing cost of the multilayer substrate can be reduced.

Therefore the semiconductor device 20 of the above-mentioned structure enables efficient electrode arrangement and power supply wiring paths, and an improvement of performance and const reduction can be achieved while reducing the IR drop.

Figure 11:
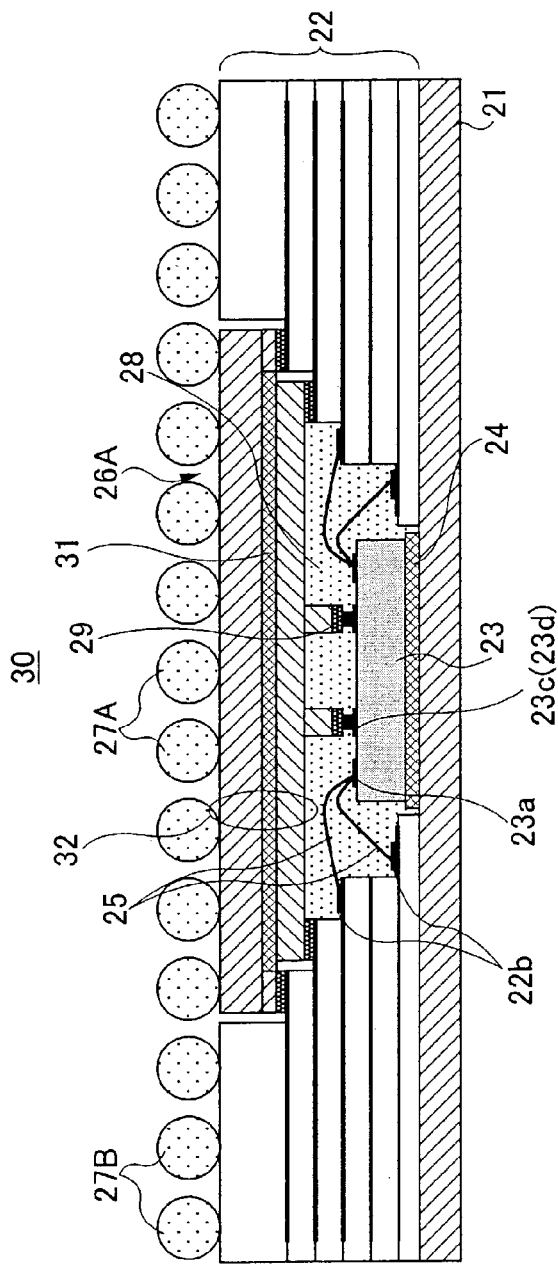
FIG. 11 is a cross-sectional view of a semiconductor device according to a sixth embodiment of the present invention.

A description will now be given, with respect to FIG. 11, of a sixth embodiment of the present invention. In FIG. 11, parts that are the same as the parts shown in FIG. 9 are given the same reference numerals, and descriptions thereof will be omitted. A semiconductor device 30 shown in FIG. 11 has a multilayer substrate 26A which corresponds to the expanded multilayer substrate 26 for power supply of the semiconductor device 20 shown in FIG. 9. The multilayer substrate 26A is connected also to the multilayer substrate 22 for signal wiring, and passive elements such as capacitors are formed in the multilayer substrate 26A.

Namely, wiring, which connects power supply electrodes 23c and the grounding electrodes 23d of the semiconductor element 23 to the solder ball 27A as external connection electrodes, is formed in the multilayer substrate 26A. Additionally, a capacitor 32 is formed in the multilayer substrate 26A by forming a dielectric layer 31 between a conductor wiring layer (metal plate) for power supply and a conductor wiring layer (metal plate) for grounding formed in each layer of the multilayer substrate 26A. The capacitor 32 can be functioned as a capacitor for noise reduction of the power supply line and the grounding line of the semiconductor device 30.

It should be noted that other than the capacitor 32, for example, an inductance may be formed as a passive element formed in the multilayer substrate 26A.

As mentioned above, the semiconductor device 30 according to the sixth embodiment has an effect, in addition to the advantages of the semiconductor device 20 according to the fifth embodiment, that the passive element can be easily formed and arranged near the semiconductor element.

Figure 12:
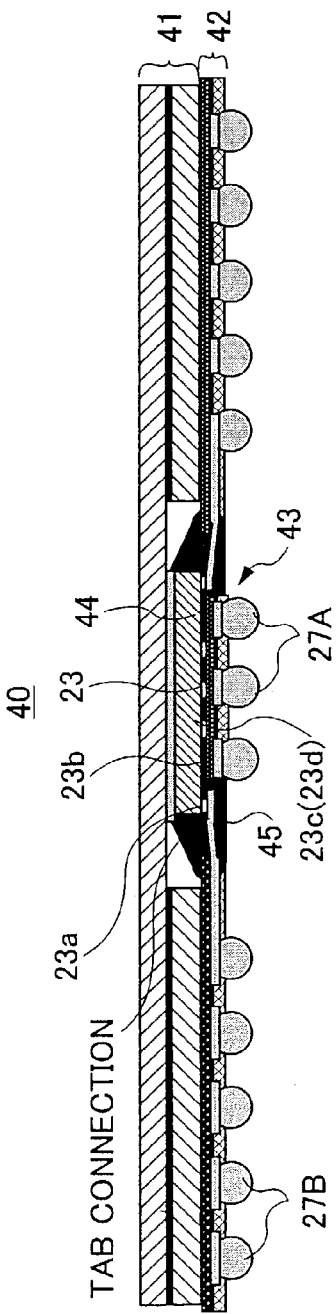
FIG. 12 is a cross-sectional view of a semiconductor device according to a seventh embodiment of the present invention.

A description will now be given, with respect to FIG. 12, of a seventh embodiment of the present invention. FIG. 12 is a cross-sectional view of a semiconductor device according to the seventh embodiment of the present invention. In the semiconductor device 40 shown in FIG. 12, the power supply structure from the central portion according to the above-mentioned fifth embodiment is applied to a BGA type semiconductor device using so-called tape automated bonding (TAB).

In the semiconductor device 40, the semiconductor element 23 is accommodated in an opening 41a formed in a conductive part 41 (substrate) serving as a base. The conductive part is made of a sheet-like metal member, and may have an integrated structure or a stacked structure. In order to form the opening 41a, it is preferable to form the conductive part in a stacked structure as shown in FIG. 12.

After TAB connection of the semiconductor element 23 is performed to a flexible board 42 (first wiring substrate), the semiconductor element 23 is positioned in the opening 41a of the conductive part 41, and the back surface, which is opposite to the circuit formation surface 23b, is bonded to the conductive part 41. Among the electrodes of the semiconductor element 23, only the electrodes 23a, which are arranged in the peripheral portion of the circuit formation surface, are connected by the TAB connection.

Then, a substrate 43 (second wiring substrate) having a similar structure to the flexible board 42 is connected via connection members 44 to the power supply electrodes 23c and the grounding electrodes 23d arranged in the central portion of the circuit formation surface 23b of the semiconductor element 23. The solder balls 27A are formed in the front surface of the substrate 43 as external connection terminals, and solder balls 27B are formed also in the front surface of the flexible board 42.

The semiconductor element 23 and the TAB connection parts are encapsulated by a seal resin 45, and the substrate 43 is also fixed by a seal resin 44. It should be noted that the electrode arrangement of the semiconductor element 23 is the same as that of the electrode arrangement shown in FIGS. 10A through 10A, and a description thereof will be omitted.

The semiconductor device 40 to which the above-mentioned TAB connection is applied has the same advantages as the above-mentioned fifth embodiment, and, in addition, the connection of the semiconductor element can be simplified by the TAB connection and the thickness of the semiconductor device can be reduced.

Figure 13:
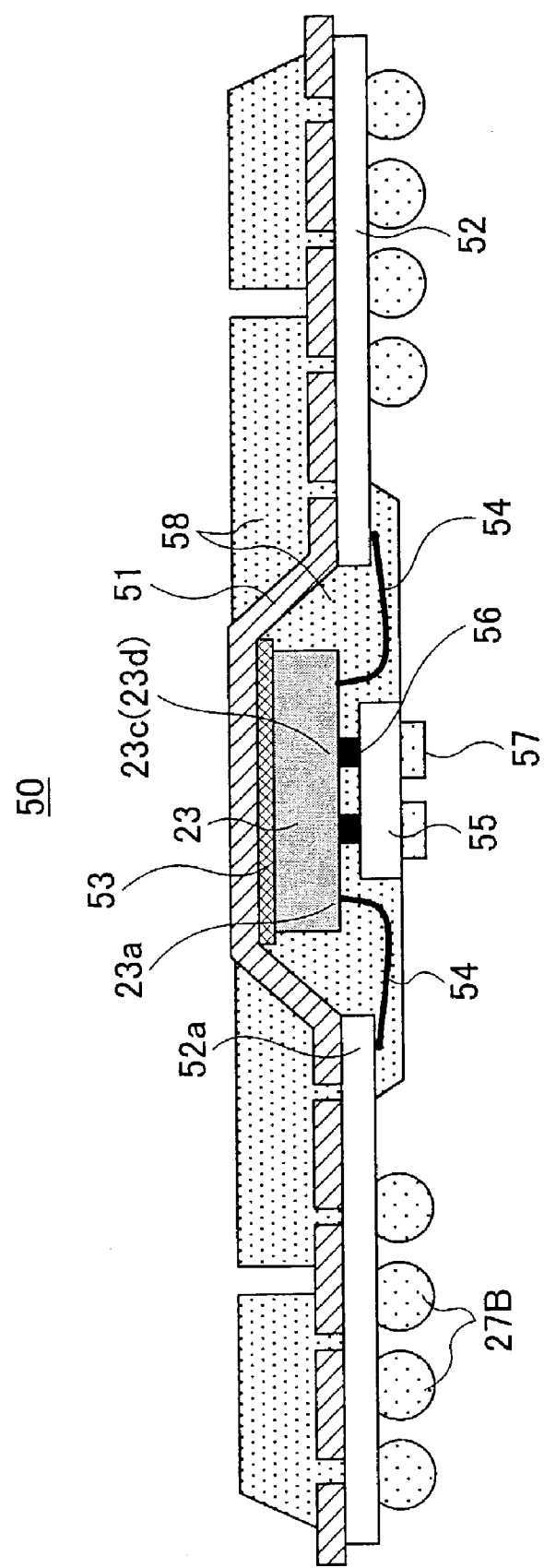
FIG. 13 is a cross-sectional view of a semiconductor device according to an eighth embodiment of the present invention.

Next, a description will be given, with reference to FIG. 13, of an eighth embodiment of the present invention. FIG. 13 is a cross-sectional view of a semiconductor device according to the present invention. In the semiconductor device 50 shown in FIG. 13, the power supply structure from the central portion according to the above-mentioned fifth embodiment is applied to the BGA type semiconductor device (FDHBGA) referred to as a face-down heat sink.

Namely, the semiconductor device 50 shown in FIG. 13 comprises a conductive part (substrate) 51 having a recess formed in the center thereof and the semiconductor element 23 placed in the recess of the conductive part 51. A multilayer substrate 52 (first wiring substrate), which has an opening at a position corresponding to the recess, is attached to the conductive part 51. The back surface of the semiconductor element 23 which opposite to the circuit formation surface 23b is fixed to a bottom surface of the recess by a solder paste or adhesive 53. The conductive part 51 functions as a grounding part, and also functions as a heat sink.

The electrodes 23a arranged around the circuit formation surface 23b of the semiconductor element 23 are connected to electrode 52a of the multilayer substrate 52 by bonding wires 54. On the other hand, a multilayer substrate 55 (second wiring substrate) having the same structure as the multilayer substrate 52 is connected, through connection members 65 such as bumps, to the power supply electrodes 23c and the grounding electrodes 23d arranged in the central portion of the circuit formation surface 23b of the semiconductor element 23. Electrode pads as external connection terminals are provided on the front surface of the multilayer substrate 55, and a solder coating 57 is formed on the electrode pads. The solder coating 57 corresponds to the above-mentioned solder balls 27A, and functions as external connection electrodes for power supply or grounding. Additionally, the solder balls 27B are also formed on the front surface of the multilayer substrate 52.

The semiconductor element 23, the bonding wires 25 and the multilayer substrate 55 are encapsulated by a seal resin 58 within the recess of the conductive part 51. It should be noted that the electrode arrangement configuration of the semiconductor element 23 is the same as that of the electrode arrangement shown in FIGS. 10A through 10D, and descriptions thereof will be omitted. The semiconductor device 40 having the abovementioned structure has the same advantage as the above-mentioned fifth embodiment, and, in addition, reduces the manufacturing cost and thickness of the semiconductor device by using the multilayer substrate having a relatively simple structure.

Next, a description will be given of a semiconductor device according to a ninth embodiment of the present invention. The semiconductor device according to the ninth embodiment of the present invention has a structure in which electrodes are formed also in a part inside the peripheral arrangement electrodes of the conventional semiconductor element having the peripheral arrangement electrodes and the electrodes are connected to the peripheral arrangement electrodes by wire bonding.

Figure 14:
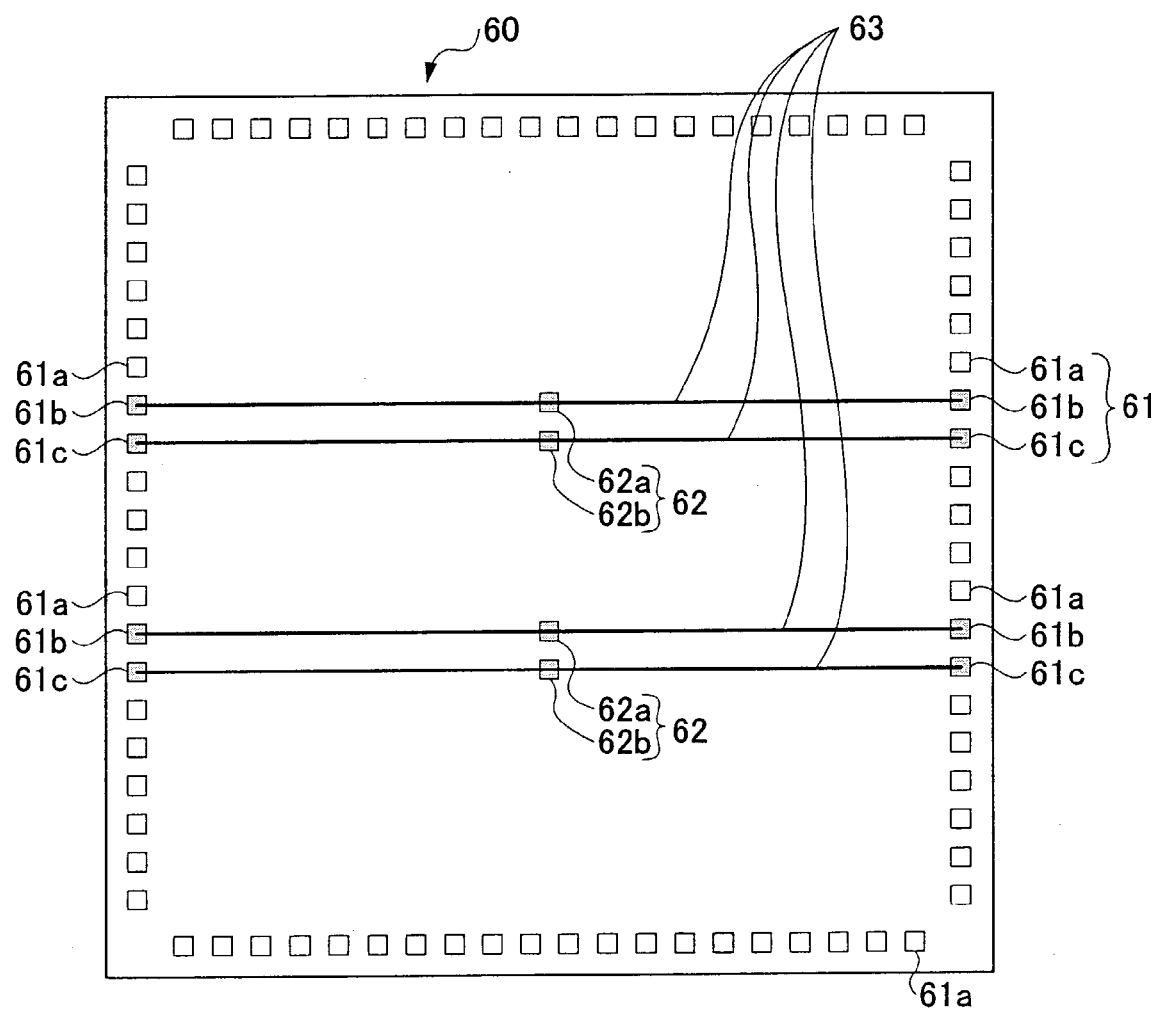
FIG. 14 is a plan view of a semiconductor element used in a semiconductor device according to a ninth embodiment of the present invention.

First, a description will be given of the semiconductor device according to the ninth embodiment. FIG. 14 is a plan view of a semiconductor element 60 used in the semiconductor device according to the ninth embodiment of the present invention.

The semiconductor element 60 has a peripheral arrangement electrode structure in which electrodes 61 are arranged in a single row in the peripheral portion of a circuit formation surface. The electrode 61 includes electrodes 61a for signals, power supply electrodes 61b and grounding electrodes 61c. Here, in the present embodiment, in addition to the peripheral arrangement electrodes 61, electrodes 62 are provided in an area inside the area in which the peripheral arrangement electrodes 61 are arranged. The electrodes 62 include power supply electrodes 62a and grounding electrodes 62b.

The power supply electrodes 62a are wire-bonded to the peripheral arrangement power supply electrodes 61b by bonding wires 63. Similarly, the power supply electrodes 62b are wire-bonded to the peripheral arrangement grounding electrodes 61c by the bonding wires 63. The bonding wire 63 is made of a metal wire such as gold or aluminum.

In the semiconductor element 60 having the above-mentioned electrode structure, an electric power is supplied from the power supply electrodes 62a to the circuits arranged in the central part of the semiconductor element 60, that is, in the area inside the area in which the peripheral arrangement electrodes are arranged. In a case where power supply is performed from the power supply electrodes 61b which are arranged in the periphery as is in the conventional one, power supply to the central portion of the semiconductor element can be performed only through the power supply wiring formed on the semiconductor element. Since there is a limit in the width (area) of the power supply wiring formed on a semiconductor element and a resistance value is not able to be reduced, there is a problem in that a voltage drop (IR drop) occurs due to the resistance value.

In the present embodiment, an electric power is supplied temporarily from the peripheral arrangement power supply electrodes 61b to the power supply electrodes 62a located in the central portion, and then supplied to the power supply wiring in the peripheral portion. The bonding wire has a very large cross-sectional area as compared to the power supply wiring on a semiconductor element, and, thus, the voltage drop (IR drops) due to the direct-current resistance value is very small. Therefore, according to the present embodiment, the direct-current resistance value to internal power supply wiring or internal grounding wiring can be reduced greatly without increasing the number of the internal power supply and grounding electrodes of peripheral arrangement and increasing the number of layers exclusive for power supply or grounding.

Figure 15A:
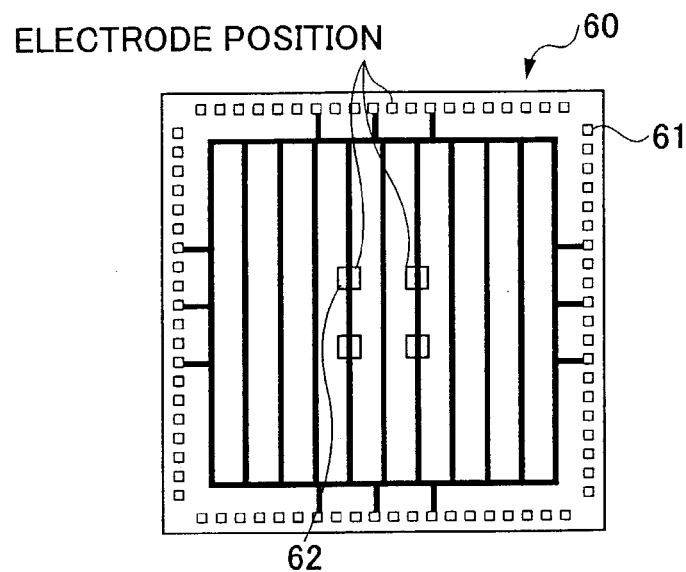
FIGS. 15A and 15B are illustrations showing power supply wiring or grounding wiring provided under an insulating layer of a semiconductor element.
Figure 15B:
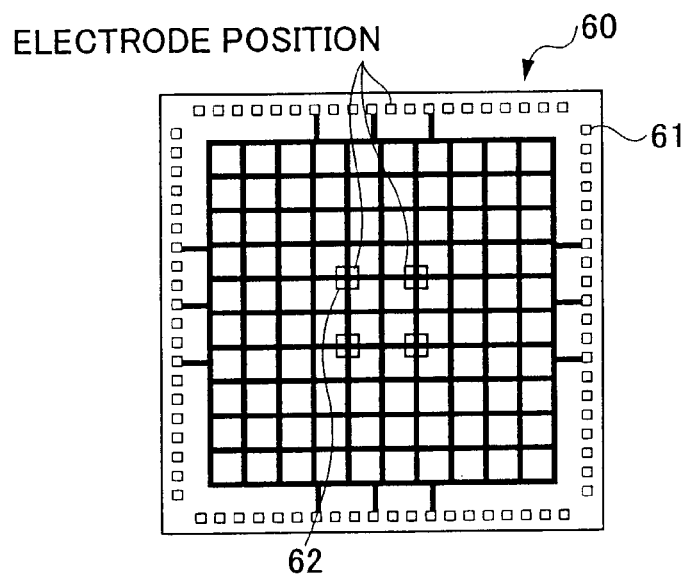

FIGS. 15A and 15B show the power supply wiring or grounding wiring provided under the insulating layer of the semiconductor element 60. FIG. 15A shows wiring arranged in the form of a fence, and the electrodes 62 are formed in the position which overlaps with wiring of the central portion. FIG. 15B shows wiring arranged in the form of a lattice, and the electrodes 62 are provided at intersections of wirings in the central portion.

Figure 16:
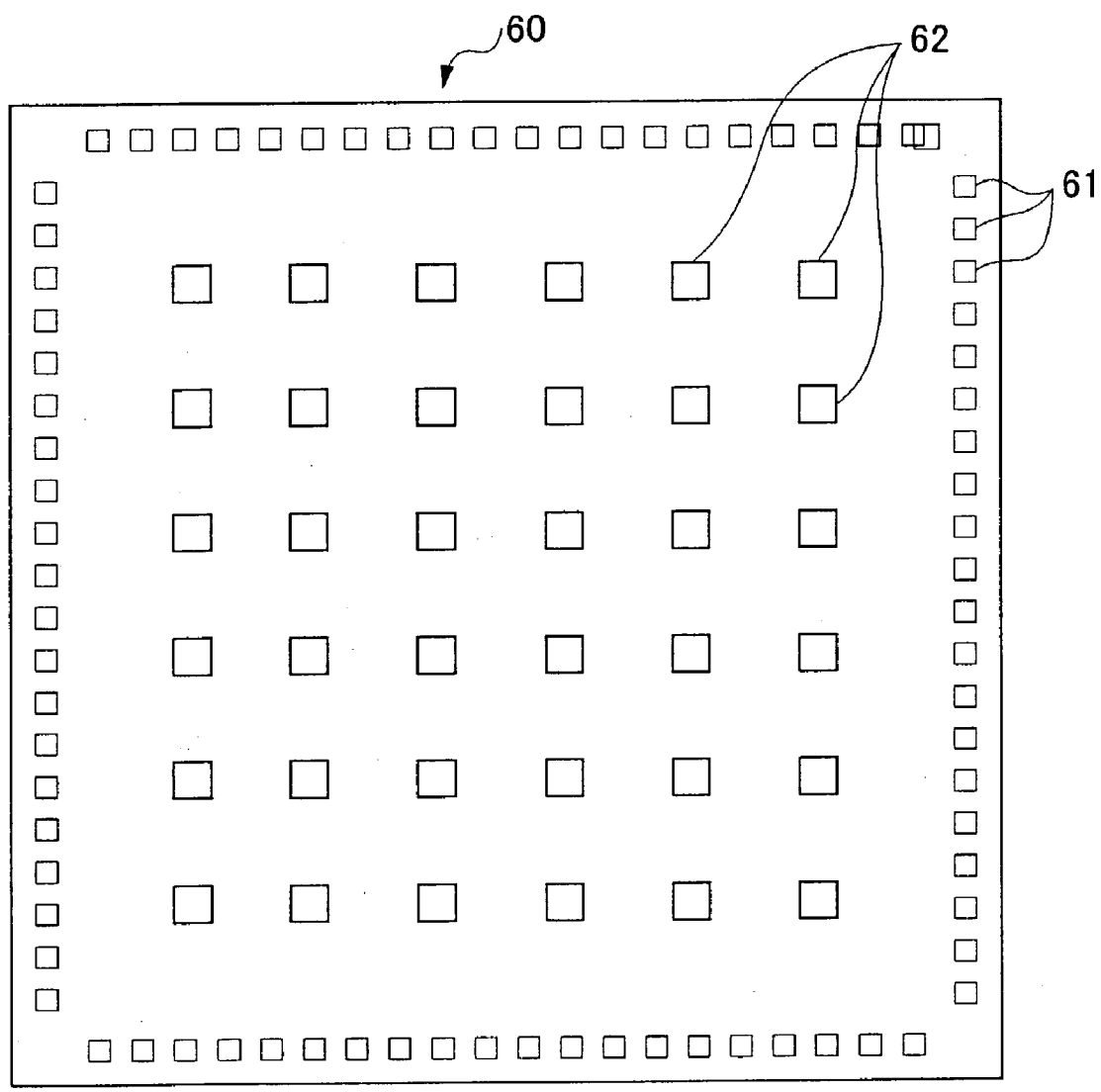
FIG. 16 is a plan view of a semiconductor element used in a semiconductor device according to a ninth embodiment of the present invention.

Here, the location of the electrodes 62 is not limited to the central portion of the semiconductor element 60, and the electrodes 62 may be provided in a portion which requires particularly a large amount of power. For example, as shown in FIG. 16, a plurality of electrodes 62 may be provided inside the peripheral arrangement electrodes 61. In FIG. 16, the peripheral arrangement electrodes 61 are arranged in an area within 1 mm from the edge of the semiconductor element 60. Additionally, the electrodes 62 are larger than the electrodes 61, and are provided in an area apart from the edge of the semiconductor element more than 1 mm.

In order to join the bonding wires 63 easily and reliably, the surfaces of the electrodes 62 are preferably formed of Al or Al base alloy, Cu or Cu base alloy, Au or Au base alloy, Pd or Pd base alloy, or Pt or Pt base alloy. Moreover, for example, a portion of the semiconductor element 60, which causes a large voltage drop, may be specified and the electrodes 62 may be provided in the specified portion. That is, a surface insulating layer of the portion specified by simulation is removed so as to form the electrodes 62.

A description will now be given, with reference to FIGS. 17 through 20, of a bonding method of the bonding wires 63.

Figure 17:
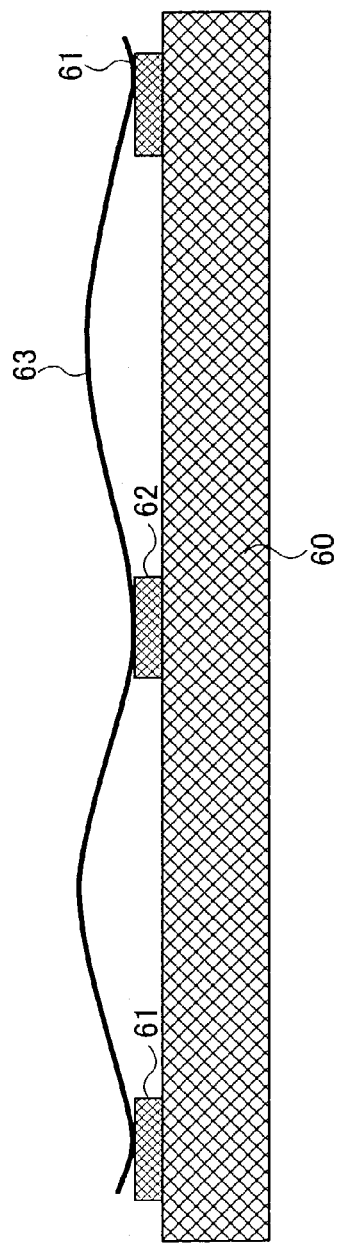
FIG. 17 is a side view of an example of connection between electrodes by a bonding wire by stitch-bonding.

FIG. 17 shows an example in which the electrode 61 and the electrode 62 are connected by a single bonding wire 63 by stitch bonding which is one of the wire connection methods. In the example shown in FIG. 17, the stitch bonding is performed using a wedge bonding techniques. Namely, a single bonding wire 63 is stretched over the electrode 61 and the electrode 62, and bonding is performed by pressing the bonding wire 63 onto the electrodes 61 and 62 by a wedge.

Figure 18:
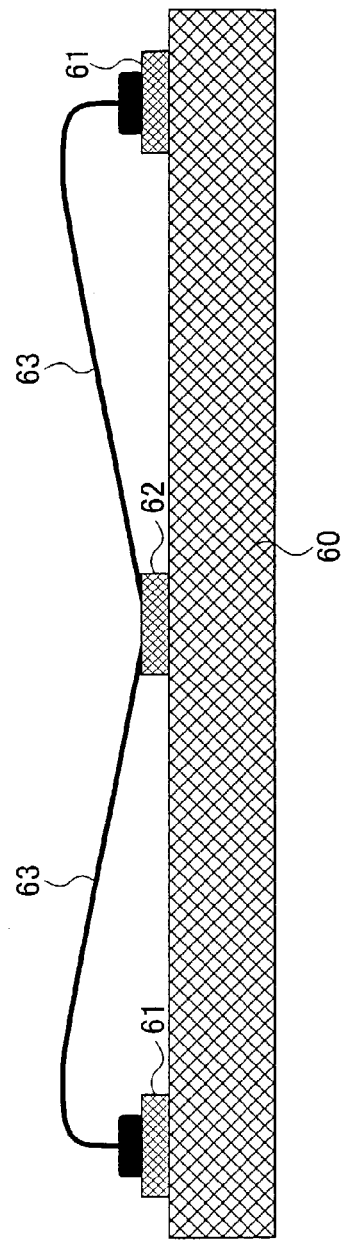
FIG. 18 is a side view of an example of connection between electrodes by a bonding wire by ball-bonding.

FIG. 18 shows an example in which the electrode 61 and the electrode 62 are connected by the bonding wires 63 by wire bonding which is one of the wire connection methods. In the example shown in FIG. 18, bonding is performed to the central electrode 62 from the electrodes 61 on either side separately by using a ball bonding technique. Therefore, an area of the central electrode 62 is larger than the area of the electrodes 61 on the left and right sides.

Figure 19:
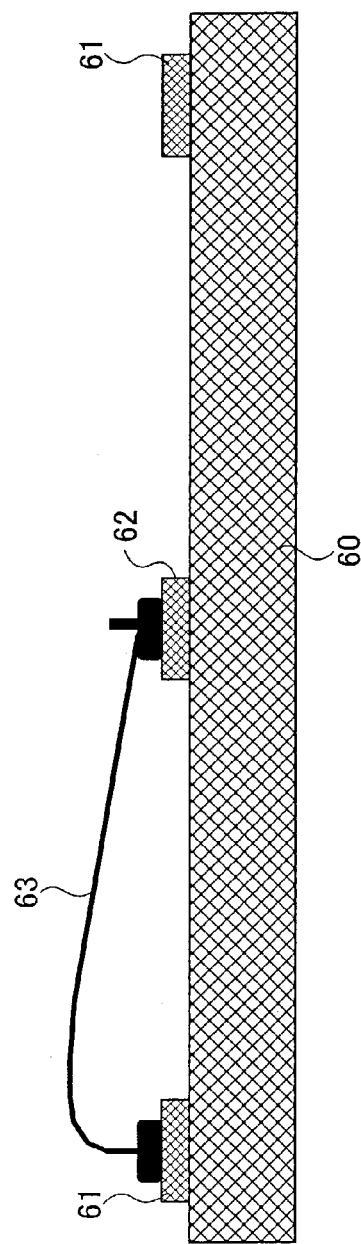
FIG. 19 is a side view of an example of connection between electrodes by a bonding wire by a stud bump and ball-bonding.

FIG. 19 shows an example in which the electrode 61 and the electrode 62 are connected by the bonding wires 63 by wire bonding which is one of the wire connection methods. In the example shown in FIG. 19, a stud bump is first formed on the central electrode 62 using a ball bonding technique. Then, bonding is performed to the stud bump of the central electrode 62 separately from the electrodes 61 on the left and write sides.

Figure 20:
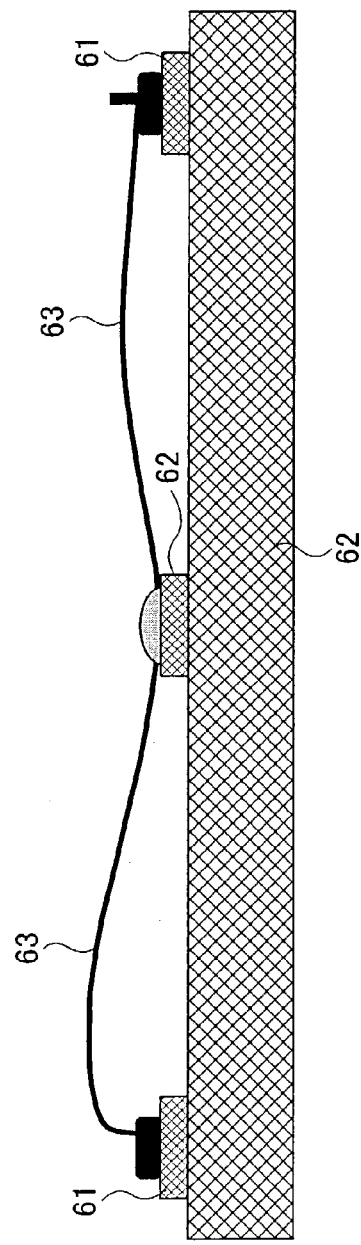
FIG. 20 is a side view of an example of connection between electrodes by a bonding wire by stud bumps and ball-bonding.

FIG. 20 shows an example in which the electrode 61 and the electrode 62 are connected by the bonding wires 63 by wire bonding which is one of the wire connection methods. In the example shown in FIG. 20, a stud bump is first formed on the electrode 61 on the right side, and the bonding wire is stretched from the left electrode 61 to the right electrode 61 using a ball bonding technique. Then, a solder paste is applied to the bonding wire 63 at a position corresponding to the electrode 62, and connect the bonding wire 63 to the electrode 62.

By the above-mentioned bonding methods, the electrodes 62 located in the central portion of the semiconductor element 60 are connectable to the electrodes 61 arranged in the peripheral portion. For example, power supply electrodes 61b of the peripheral arrangement are connected to the power supply electrodes 62a arranged on the inner side are connected by the bonding wires 63 so as to supply a power from the peripheral arrangement power supply electrodes 61b to the power supply electrodes 62a through the bonding wires 63.

Figure 21:
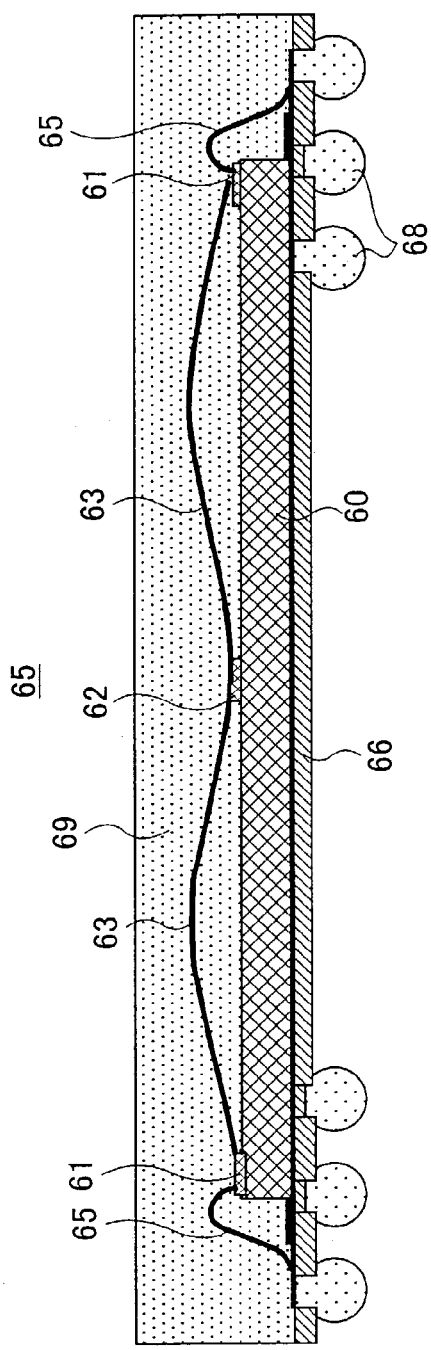
FIG. 21 is a cross-sectional view of a semiconductor device according to the ninth embodiment of the present invention.

FIG. 21 is a cross-sectional view of a semiconductor device 65 according to a ninth embodiment of the present invention. The semiconductor element 60 in which the electrodes 61 and the electrodes 62 are connected by the above-mentioned bonding method (stitch bonding shown in FIG. 17 in this example) is mounted on the wiring substrate 66, and the peripheral arrangement electrodes 61 are connected to the electrode pads 66a of the wiring substrate 88 by bonding wires 67. The electrode pads 66a are connected to the solder balls 68 as external connection terminals through wiring in the wiring substrate 66. The semiconductor element 60, the bonding wires 63 and the bonding wires 67 are encapsulated by a seal-resin 69.

According to the above-mentioned semiconductor device 65, a voltage externally supplied through the external connection terminals is first supplied to peripheral arrangement electrodes 61 (power supply electrodes 61b) through the bonding wires 65, and then supplied to the electrodes 62 (power supply electrodes 62a) in the central portion through the bonding wires. A power to the circuits near the peripheral arrangement electrodes 61 (power supply electrodes 61b) is supplied through the electrodes 61, and a power to the circuits near the electrodes 62 (power supply electrodes 62a) is supplied through the electrodes 62.

Therefore, according to the present embodiment, power supply or grounding can be made to the circuit near the central portion of the semiconductor element through the bonding wires 63. For this reason, the wiring to the electrodes 62 (electrodes located in an inner side of the peripheral arrangement electrodes 61) located near the central portion of the semiconductor element 60 can be made by bonding wires 63 which have a larger cross-sectional area than the circuit wiring formed in the semiconductor element 60. Therefore, the direct-current resistance value of the power supply wiring or grounding wiring to the circuits formed in the semiconductor element 60 can be greatly reduced.

Figure 22:
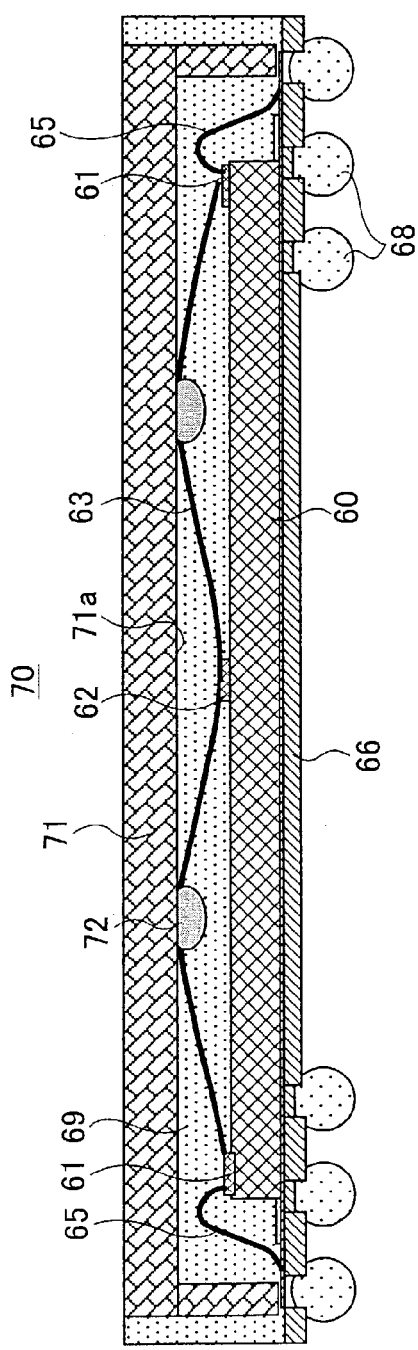
FIG. 22 is a cross-sectional view of a semiconductor device according to a tenth embodiment of the present invention.

FIG. 22 is a cross-sectional view of a semiconductor device 70 according to a tenth embodiment of the present invention. In FIG. 22, parts that are the same as the parts shown in FIG. 21 are given the same reference numerals, and descriptions thereof will be omitted.

The semiconductor device 70 has a structure in which a conductive member 71 is added to the semiconductor device 65 shown in FIG. 21. The conductive member 71 is made of a metal, and is connected to the electrode pads of the wiring substrate 66 in a state where the conductive member 71 is bridged over the semiconductor element 60. Additionally, the bonding wires 63 are connected to a surface 71a of the conductive member 71, which faces the semiconductor element 60, by a solder 72. The electrodes 61 and electrodes 62 shown in FIG. 22 are, for example, grounding electrodes, and the conductive member 71 is connected to the electrode pads on the grounding wiring of the wiring substrate 66. Therefore, the electrodes 62 are electrically connected to the wiring substrate 66 through the conductive member 71 in addition to the bonding wires 63, thereby further reducing the direct-current resistance value.

Figure 23:
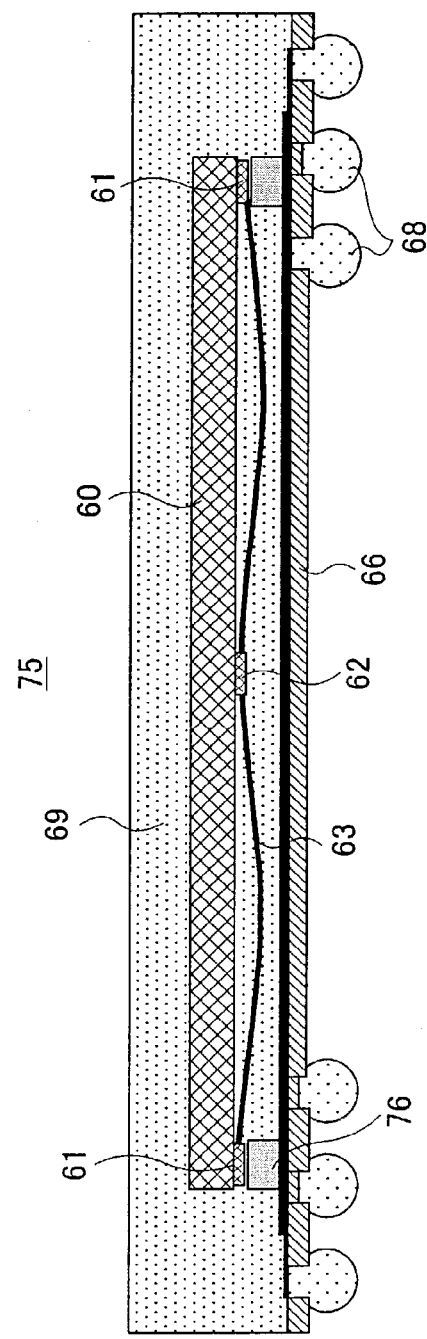
FIG. 23 is a cross-sectional view of a semiconductor device according to an eleventh embodiment of the present invention.

FIG. 23 is a cross-sectional view of a semiconductor device 75 according to an eleventh embodiment of the present invention. In FIG. 23, parts that are the same as the parts shown in FIG. 21 are given the same reference numerals, and descriptions thereof will be omitted.

The semiconductor device 75 has a structure in which protruding electrodes such as bumps are formed on the electrodes 61 of the semiconductor element 60 shown in FIG. 21 and the semiconductor element 60 is flip-chip mounted on the wiring substrate 66 with the circuit formation surface facing the wiring substrate 66 (face-down). Accordingly, the bonding wires 63 connecting the electrodes 61 and 62 are located between the circuit formation surface of the semiconductor element 60 and the wiring substrate 66.

Figure 24:
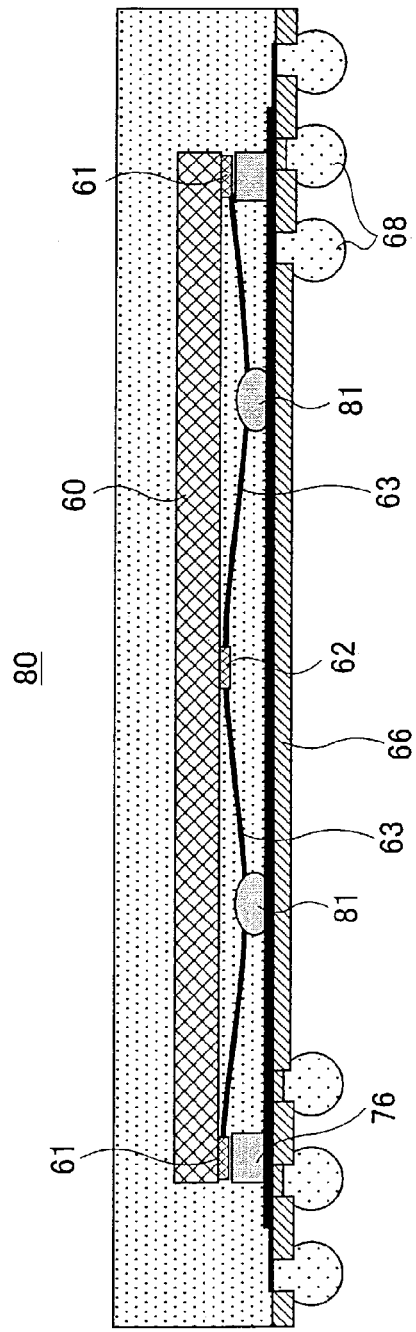
FIG. 24 is a cross-sectional view of a semiconductor device according to a twelfth embodiment of the present invention.

FIG. 24 is a cross-sectional view of a semiconductor device 80 according to a twelfth embodiment of the present invention. In FIG. 24, parts that are the same as the parts shown in FIG. 22 are given the same reference numerals, and descriptions thereof will be omitted.

In the semiconductor device 80, the bonding wires 63 in the semiconductor device 70 are electrically connected to the wiring substrate by a solder 81. Therefore, the electrodes 62 can be electrically connected to the wiring substrate 66 only through the bonding wires 63, thereby further reducing the direct-current resistance value.

Figure 25:
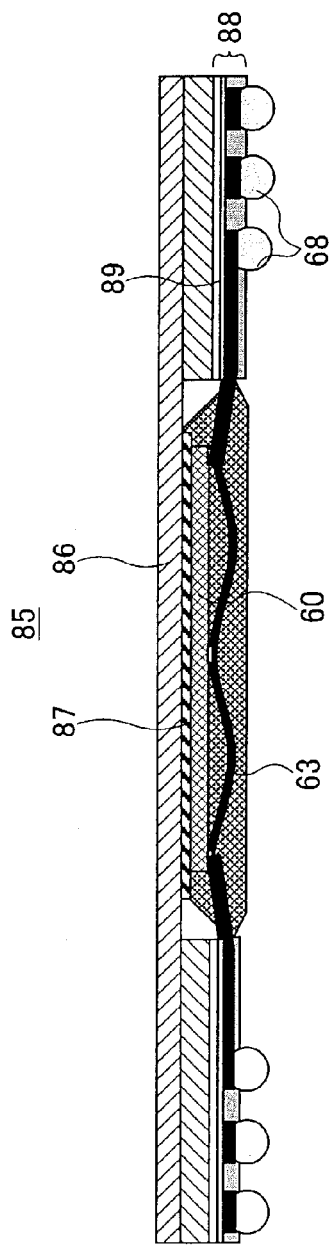
FIG. 25 is a cross-sectional view of a semiconductor device according to a thirteenth embodiment of the present invention.

FIG. 25 is a cross-sectional view of a semiconductor device 85 according to a thirteenth embodiment of the present invention. In FIG. 25, parts that are the same as the parts shown in FIG. 21 are given the same reference numerals, and descriptions thereof will be omitted.

In the semiconductor device 85, the semiconductor element 60 is mounted onto a conductive member 86 via an adhesive 87. A flexible board 88 (TAB substrate) is mounted onto the conductive member 86 via a spacer member 89, and the flexible board 88 is connected to the semiconductor element 60 by TAB connection. The solder balls 68 as external connection terminals are formed on the flexible board 88.

Figure 26:
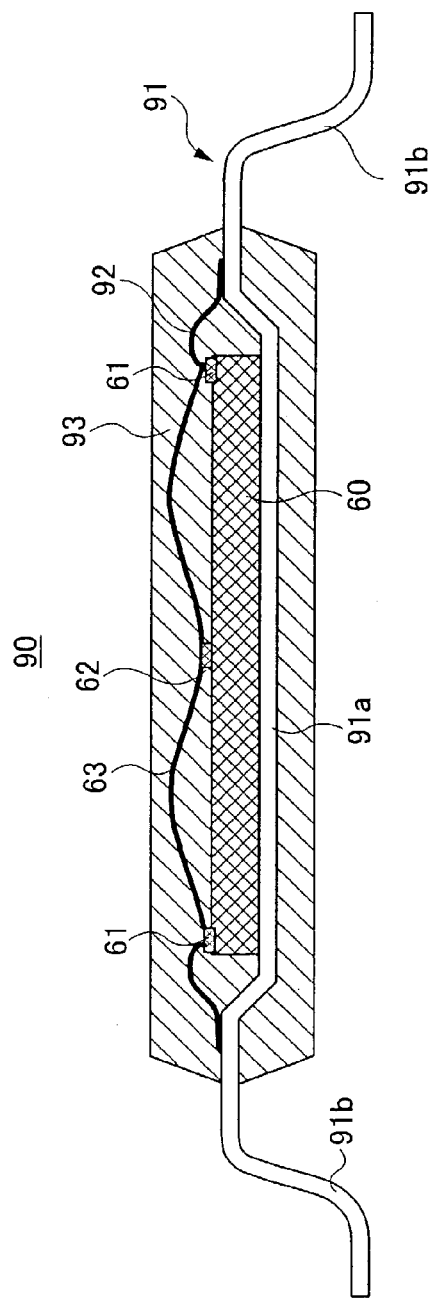
FIG. 26 is a cross-sectional view of a semiconductor device according to a fourteenth embodiment of the present invention.

FIG. 26 is a cross-sectional view of a semiconductor device 90 according to a fourteenth embodiment of the present invention. In FIG. 26, parts that are the same as the parts shown in FIG. 21 are given the same reference numerals, and descriptions thereof will be omitted.

The semiconductor device 90 is formed as a lead terminal type package of the semiconductor element 60. That is, the semiconductor element 60 is mounted on a stage 91a of a lead frame 91, and the electrodes 61 are connected to lead terminals 91b of the lead frame 91 by bonding wires 92. The stage 91a, the semiconductor element 60, the bonding wires 63 and the bonding wires 92 are encapsulated by a seal resin 93.

The present invention is not limited to the specifically disclosed embodiments, and variations and modifications may be made without departing from the scope of the present invention.

The present invention is based on Japanese priority application No. 2002-158277 filed on May 30, 2002, the entire contents of which are hereby incorporated by reference.

What is claimed is:

1. A semiconductor device comprising:
   a first wiring board formed on a substrate and having an opening through which a surface of the substrate is exposed;
   a semiconductor element located in the opening and having a back surface opposite to a circuit formation surface, the back surface being bonded to said substrate;
   bonding wires which connect electrodes formed on said first wiring board to first electrodes arranged in a peripheral part of the circuit formation surface of said semiconductor element;
   a second wiring board facing the circuit formation surface of said semiconductor element and having connection members which are connected to second electrodes arranged in a center part of said circuit formation surface;
   first wirings located in said first wiring board;
   second wirings located in said second wiring board;
   a resin located between said first and second wiring boards;
   first external connection terminals formed on said second wiring board and electrically connected to said second electrodes of said semiconductor element through said second wirings in said second wiring board and said connection members;
   second external connection terminals formed on said first wiring board electrically connected to said first electrodes of said semiconductor element through wirings in said first wiring board and said bonding wires;
   wherein said second wirings are free of contact with said resin;
   wherein the first external connection terminals on the second wiring board and the second electrodes on the semiconductor element align respectively, and the second wirings directly connect the first external connection terminals and the connection members by extending in a vertical direction.

2. The semiconductor device as claimed in claim 1, wherein said first electrodes of said semiconductor element are electrodes directly connected to signals and power supply or grounding elements; said second electrodes are electrodes directly connected to power supply and grounding elements; and an arrangement pitch and an electrode size of said second electrodes are larger than an arrangement pitch and an electrode size of said first electrodes.

3. The semiconductor device as claimed in claim 2, wherein said second electrodes are formed along circuit wirings for power supply or grounding formed on the circuit formation surface of said semiconductor element.

4. The semiconductor device as claimed in claim 1, wherein said connection members of said second wiring board are made of a thermally meltable conductive material.

5. The semiconductor device as claimed in claim 1, wherein said connection members of said second wiring board are made of a metal wire formed in the shape of a loop.

6. The semiconductor device as claimed in claim 1, wherein said second electrodes of a said semiconductor element have an elongated shape, and said connection members of said second wiring board are made of a metal wire or a metal foil formed by stitch-bonding provided along said second electrodes.

7. The semiconductor device as claimed in claim 1, wherein said substrate is made of an electrically conductive material and the back surface of said semiconductor element is joined to said substrate by an electrically conductive bonding material.

8. The semiconductor device as claimed in claim 1, wherein said first wiring board is a multi-layer wiring board, and said first electrodes of said semiconductor element are connected to electrodes formed in a different layer of said first wiring board through bonding wires.

9. The semiconductor device as claimed in claim 1, wherein said second wiring board is a multi-layer wiring board, and a passive element is formed on at least one of said first and second wiring boards.

10. The semiconductor device as claimed in claim 9, wherein passive element is a bypass capacitor.

11. The semiconductor device as claimed in claim 1, wherein said semiconductor element is located in a recess formed in said substrate; said first wiring board is a flexible board; and electrodes of said flexible board are connected to said first electrodes of said semiconductor element by TAB connection.

12. A semiconductor device comprising:
    a first wiring board formed on a substrate;
    a semiconductor element being bonded to said substrate;
    bonding wires that connect electrodes formed on said first wiring board to first electrodes arranged on said semiconductor element;
    a second wiring board connected to said semiconductor element according to a flip-chip connection, said second wiring board having connection members which are connected to second electrodes arranged in a center part of a surface of said semiconductor element;
    first external connection terminals formed on said second wiring board;
    second external connection terminals formed on said first wiring board; and
    wherein the first external connection terminals on the second wiring board and the second electrodes on the semiconductor element align respectively, and second wirings directly connect the first external connection terminals and the connection members by extending in a vertical direction.

* * * * *